(12) United States Patent
Kohiyama et al.

(10) Patent No.: US 6,893,784 B2
(45) Date of Patent: May 17, 2005

(54) CARBOXYL GROUP-CONTAINING PHOTOSENSITIVE RESIN, ALKALI-DEVELOPABLE, PHOTOCURABLE AND THERMOSETTING COMPOSITION CONTAINING THE SAME, AND CURED PRODUCTS THEREOF

(75) Inventors: Noboru Kohiyama, Oume (JP); Shigeru Ushiki, Hiki-gun (JP)

(73) Assignee: Taiyo Ink Manufacturing Co., Ltd. (JP)

( * ) Notice: Subject to any disclaimer, the term of this patent is extended or adjusted under 35 U.S.C. 154(b) by 66 days.

(21) Appl. No.: 10/390,779

(22) Filed: Mar. 19, 2003

(65) Prior Publication Data

US 2003/0215746 A1 Nov. 20, 2003

Related U.S. Application Data

(63) Continuation of application No. PCT/JP01/07966, filed on Sep. 13, 2001, now abandoned.

(30) Foreign Application Priority Data

Sep. 20, 2000 (JP) .................................. 2000-285719
Oct. 31, 2000 (JP) .................................. 2000-332850

(51) Int. Cl.$^7$ .................... G03F 7/038; C09D 5/25; C09D 163/00; C09D 171/10
(52) U.S. Cl. ................. 430/18; 430/280.1; 430/285.1; 525/451; 525/502; 525/507; 525/508; 522/107; 522/108
(58) Field of Search .................... 430/18, 280.1, 430/285.1; 525/451, 502, 507, 508; 522/107, 108

(56) References Cited

U.S. PATENT DOCUMENTS

| | | | | |
|---|---|---|---|---|
| 2,581,390 A | * | 1/1952 | De Groote et al. | 525/507 |
| 3,248,276 A | * | 4/1966 | Bean, Jr. | 525/502 |
| 3,373,127 A | * | 3/1968 | Bean, Jr. | 525/508 |
| 3,637,385 A | * | 1/1972 | Hayes et al. | 430/330 |
| 3,800,005 A | * | 3/1974 | Sherwood et al. | 525/502 |
| 4,200,705 A | * | 4/1980 | Davis | 522/100 |
| 4,439,291 A | * | 3/1984 | Irving et al. | 430/287.1 |
| 5,100,989 A | * | 3/1992 | Uhrig et al. | 527/602 |

FOREIGN PATENT DOCUMENTS

| | | | | |
|---|---|---|---|---|
| GB | 1484278 A | * | 9/1977 | C08F/283/00 |
| GB | 2113690 A | * | 8/1983 | C08G/59/14 |
| JP | 02 - 6517 A | * | 1/1990 | |

OTHER PUBLICATIONS

Murase et al, PTO 04–4157, English Translation of Japanese Kokai Patent Application No Hei 2[1990]–6517by the Ralph McElroy Translation Company for the USPTO, Washington, D.C., Jul. 2004, 9 pages.*
"Colophony", Contact Dermatitis Clinic, Department of Dermatology, 2 Pages Copyright AFY 1993.from www.uk-dermatology.co.uk/downloads/Colophony.doc.*
RN 514–10–3, Abietic acid, Registry File, ACS on STN, 2 pages, 2004.*
DERWENT–ACC–NO.: 1990–054140, English abstract of Murase et al, JP 02006517 A, two pages, 1999.*
Publication No.: 02–006517, Murase et al, Patent Abstracts of Japan, 1998, 2 pages, English abstract of JP 02–006517.*
AN 1990: 632292, Murase et al, enters in STN Dec. 22, 1990, English abstract of JP 02006517 A2, one page, ACS on STN.*

* cited by examiner

Primary Examiner—Cynthia Hamilton
(74) Attorney, Agent, or Firm—Rader, Fishman & Grauer, PLLC; Ronald P. Kananen

(57) ABSTRACT

A carboxyl group-containing photosensitive resin is obtained by reacting an unsaturated group-containing monocarboxylic acid (d) with a reaction product (c) of a phenolic novolak resin (a) and an alkylene oxide (b) and further reacting a polybasic acid anhydride (f) with the resultant reaction product (e). A photocurable and thermosetting composition comprising (A) the carboxyl group-containing photosensitive resin mentioned above, (C) a photopolymerization initiator, and (D) an epoxy resin, or further comprising (B) a photosensitive (meth)acrylate compound, preferably further comprising (E) an organic solvent and/or (F) a curing catalyst is useful as an ultraviolet-curable type printing ink, various resists and interlaminar insulating materials to be used in the manufacture of printed circuit boards, or the like.

20 Claims, 5 Drawing Sheets

CARBOXYL GROUP-CONTAINING PHOTOSENSITIVE RESIN, ALKALI-DEVELOPABLE, PHOTOCURABLE AND THERMOSETTING COMPOSITION CONTAINING THE SAME, AND CURED PRODUCTS THEREOF

CROSS-REFERENCE TO RELATED APPLICATIONS

This is a continuation of Application PCT/JP01/07966, filed Sep. 13, 2001, now abandoned.

BACKGROUND OF THE INVENTION

1. Field of the Invention

This invention relates to a photo- and/or thermo-setting resin obtained by the chain extension of a phenolic novolak resin caused by an addition reaction of an alkylene oxide thereto and the subsequent addition of an unsaturated group-containing monocarbxylic acid and the addition of a polybasic acid anhydride thereto, and more particularly to a photo- and/or thermo-setting resin of which cured product excels in resistance to heat and toughness, exhibits high hardness and flexibility, and enjoys high water resistance and resistance to chemicals.

This invention further relates to an alkali-developable, photocurable and thermosetting composition and a cured product obtained therefrom, and more particularly relates to a liquid alkali-developable, photocurable and thermosetting composition which is suitable for use as a permanent mask to be used in the manufacture of usual printed circuit boards, flexible printed circuit boards, and tape carrier packages, interlaminar insulating layers for multi-layer circuit boards, and the like and capable of forming a cured film excelling in adhesiveness, resistance to soldering heat, resistance to moisture absorption, resistance to PCT (pressure cooker test), resistance to electroless gold plating, flexing resistance, folding endurance, flexibility, warpage, and electrical insulating properties by means of a procedure comprising the steps of irradiating a coating film of the composition with ultraviolet light, developing the exposed film with a dilute aqueous alkali solution, thereby forming an image on the film, and finally curing the film by heating, or by irradiation with active energy rays and subsequent heating, or by heating and subsequent irradiation with active energy rays.

2. Description of the Prior Art

At present, as a solder resist for part of the household grade printed circuit boards and for virtually all the industrial grade printed circuit boards, a liquid developing type solder resist which is irradiated with ultraviolet light and then developed to form an image and thereafter finally cured (finish curing) by heating or exposure to light is adopted from the viewpoint of ensuring highly accurate formation of circuits with high density. Further, with due respect to the problem of environmental safety, the liquid solder resist of the alkali developing type which implements development with a dilute aqueous alkali solution as a developer has come to play the leading role. As such alkali developing type solder resists using a dilute aqueous alkali solution, for example, published Japanese Patent Application, JP 61-243869A discloses a solder resist composition comprising a photosensitive resin obtained by addition of an acid anhydride to the reaction product of a novolak type epoxy compound with an unsaturated monobasic acid, a photopolymerization initiator, a diluent, and an epoxy compound, JP 3-253093A discloses a solder resist composition comprising a photosensitive resin obtained by addition of an acid anhydride to the reaction product of a novolak type epoxy compound with an unsaturated monobasic acid, a photopolymerization initiator, a diluent, a vinyltriazine or a mixture of vinyltriazine with dicyandiamide, and a melamine resin, and JP 3-71137A and JP 3-250012A disclose a solder resist composition comprising a photosensitive resin obtained by addition of (meth)acrylic acid to an epoxy resin resulting from the reaction of epichlorohydrin with the reaction product of salicylaldehyde and monovalent phenol and subsequent addition of a polybasic carboxylic acid or anhydride thereof to the resultant resin, a photopolymerization initiator, an organic solvent, etc.

As mentioned above, some material systems are heretofore proposed as a solder resist and currently used in large quantities in the practical manufacture of printed circuit boards. However, in view of high densification of the printed circuit board to cope with the recent trend of electronic devices toward decreasing weight and size, the desirability of producing the solder resist having high performance has been finding growing recognition. Furthermore, the IC packages using a printed circuit board having the solder resist applied thereto and a sealing resin are recently used instead of the IC packages called QFP (quad flat-pack package), SOP (small outline package), etc. which use a lead frame and a sealing resin. These new packages have such structure that metals such as ball-like solder are arranged in an area on one side of a printed circuit board having the solder resist applied thereto, the IC chips are directly connected thereto on the other side by wire bonding or through the medium of the bumps etc., and they are sealed by a sealing resin. They are called by mnemonic names, such as BGA (ball grid array) and CSP (chip scale package). These packages have more pins than other packages such as QFP of the same size, but are easier to miniaturize. Moreover, also in mounting the devices, they realize a low percent defective owing to the self-alignment effect of ball-like solder, and the introduction of these packages is advanced quickly.

In the printed circuit boards having the heretofore commercially available alkali development type solder resist, however, the PCT resistance which is the long-term reliability test of a package is inferior, which results in exfoliation of a cured film. Moreover, another matter which comes into question is the so-called popcorn phenomenon, i.e. the phenomenon that the absorbed moisture boils within the package during re-flow of the package at the step of mounting of devices and cracks occur in the solder resist film and the circumference thereof inside the package. Such problems in resistance to moisture absorption and long-term reliability are undesirable not only in the case of the above-mentioned mounting technology but also in the products for other uses, such as a solder resist of a usual printed circuit board, a solder resist to be used in the manufacture of a flexible printed circuit board, and interlaminar insulating layers of multi-layer circuit boards like a build-up board.

As mentioned above, the recent advance of the electric industry and semiconductor industry requires more improvement in the characteristics such as, for example, heat resistance, toughness, flexibility, water resistance, and resistance to chemicals. In order to satisfy such demands, various new photosensitive resins are developed.

Heretofore, the photosensitive resin originating from the novolak type epoxy resin as a start material is widely used in many fields of electronic material, such as a solder resist and an etching resist, owing to its outstanding adhesiveness, heat resistance, resistance to chemicals, electric insulation, etc. As a carboxyl group-containing photosensitive resin having particularly outstanding heat resistance, the resin obtained by causing a polybasic acid anhydride to react with a reaction product of the above-mentioned cresol novolak type epoxy resin and an unsaturated group-containing monocarboxylic acid (JP 61-243869A) is widely used. This resin is excellent in heat resistance. However, this resin has the drawback of being easy to generate cracks by the thermal shock because it causes large shrinkage during curing and exhibits low elongation and poor toughness.

As photosensitive resins which will solve such problems, a photosensitive prepolymer which is a reaction product of a bisphenol type epoxy resin having side chains of which hydroxyl groups is partially epoxidized, a (meth)acrylic acid, and a polybasic acid anhydride (JP 9-54434A), an unsaturated group-containing polycarboxylic resin obtained by causing a tetrahydrophthalic anhydride to react with a reaction product of a cresol novolak type epoxy resin, acrylic acid, and p-hydroxyphenetyl alcohol (JP 11-288091A), etc. are proposed.

However, these resins are also still insufficient to satisfy both the heat resistance and toughness.

SUMMARY OF THE INVENTION

The present invention has been made in view of the problems mentioned above and has an object to provide a carboxyl group-containing photosensitive resin capable of producing a cured product which exhibits good elongation, water resistance and resistance to chemicals and high flexibility in addition to the well-balanced heat resistance and toughness.

A further object of the present invention is to provide an alkali-developable, photocurable and thermosetting liquid composition capable of forming a cured film which keeps or improves such properties as adhesiveness, resistance to soldering heat, resistance to moisture absorption, PCT resistance, resistance to electroless gold plating, flexing resistance, folding endurance, flexibility, warpage, and electrical insulating properties required of a solder resist of a usual printed circuit board, a solder resist to be used in the manufacture of a flexible printed circuit board and a tape carrier package, an interlaminar insulating layer of a multilayer circuit board such as a build-up board, and the like, particularly excels in such properties as resistance to moisture absorption and PCT (pressure cooker) resistance required of an IC package, and capable of coping with high densification and surface mounting of a printed circuit board, and to provide a cured product obtained therefrom.

To accomplish the objects mentioned above, a first aspect of the present invention provides a carboxyl group-containing photosensitive resin (A) obtained by reacting an unsaturated group-containing monocarboxylic acid (d) with a reaction product (c) of a phenolic novolak resin (a) and an alkylene oxide (b) and further reacting a polybasic acid anhydride (f) with the resultant reaction product (e), said photosensitive resin having an acid value in the range of 30 to 150 mg KOH/g.

In accordance with a more concrete preferred embodiment of the present invention, there is provided a carboxyl group-containing photosensitive resin (A) in which the unsaturated group-containing monocarboxylic acid (d) is acrylic acid and/or methacrylic acid and the polybasic acid anhydride (f) is an alicyclic dibasic acid anhydride.

The carboxyl group-containing photosensitive resin of the present invention has improved flexibility and elongation owing to the chain extension of a phenolic novolak resin caused by an addition reaction of an alkylene oxide thereto and has an unsaturated group and a carboxylic group added to the side chain terminals thereof attained by the subsequent addition of an unsaturated group-containing monocarbxylic acid and the addition of a polybasic acid anhydride to end hydroxyl groups caused by the addition reaction of the alkylene oxide. Therefore, the resin has improved reactivity and allows the production of a cured product having well-balanced heat resistance and toughness at a high level, excelling in hardness and flexibility, and exhibiting outstanding water resistance and resistance to chemicals, in cooperation with the chain extension. Further, since the resin has end carboxylic groups, it allows the development with an aqueous alkali solution.

Another aspect of the present invention provides an alkali-developable, photocurable and thermosetting composition characterized by comprising (A) a carboxyl group-containing photosensitive resin obtained by reacting an unsaturated group-containing monocarboxylic acid (d) with a reaction product (c) of a phenolic novolak resin (a) and an alkylene oxide (b) and further reacting a polybasic acid anhydride (f) with the resultant reaction product (e), (C) a photopolymerization initiator, and (D) an epoxy resin, or an alkali-developable, photocurable and thermosetting composition characterized by further comprising (B) a photosensitive (meth)acrylate compound besides the components mentioned above. The term "(meth)acrylate" as used in the present specification refers collectively to acrylate and methacrylate. This holds good for other similar expression.

In accordance with a preferred embodiment, there is provided an alkali-developable, photocurable and thermosetting composition characterized by further comprising (E) an organic solvent and/or (F) a curing catalyst besides the components mentioned above.

In accordance with still another aspect of the present invention, there is provided a cured product obtained from the alkali-developable, photocurable and thermosetting composition mentioned above. In accordance with one preferred embodiment thereof, the composition described above is applied by the technique of screen printing process, roll coating process, curtain coating process, spray coating process, or the like to the surface of a substrate, for example a printed circuit board having a circuit preparatorily formed thereon, dried in a far infrared rays drying oven or a hot air drying oven, for example, then subjected to irradiation with active energy rays, for example, by projecting the laser beam directly on the coating film according to a prescribed pattern or selectively exposing through a photomask having a prescribed pattern by using a high-pressure mercury vapor lamp, an ultra-high-pressure mercury vapor lamp, a metal halide lamp, and an electrodeless lamp, for example, and thereafter the unexposed area of the coating film is developed with an aqueous alkali solution to form a prescribed pattern. Thereafter, by finally curing (finish curing) the film by heating, or by irradiation with active energy rays and subsequent heating, or by heating and subsequent irradiation with active energy rays, it is possible to form at a low cost with high productivity a cured film (cured product) excelling in various properties such as adhesiveness, resistance to soldering heat, resistance to moisture absorption, PCT resistance, resistance to electroless gold plating, flexing resistance, folding endurance, flexibility, warpage, and electrical insulating properties.

BRIEF DESCRIPTION OF THE DRAWINGAS

DETAILED DESCRIPTION OF THE INVENTION

Figure 1:
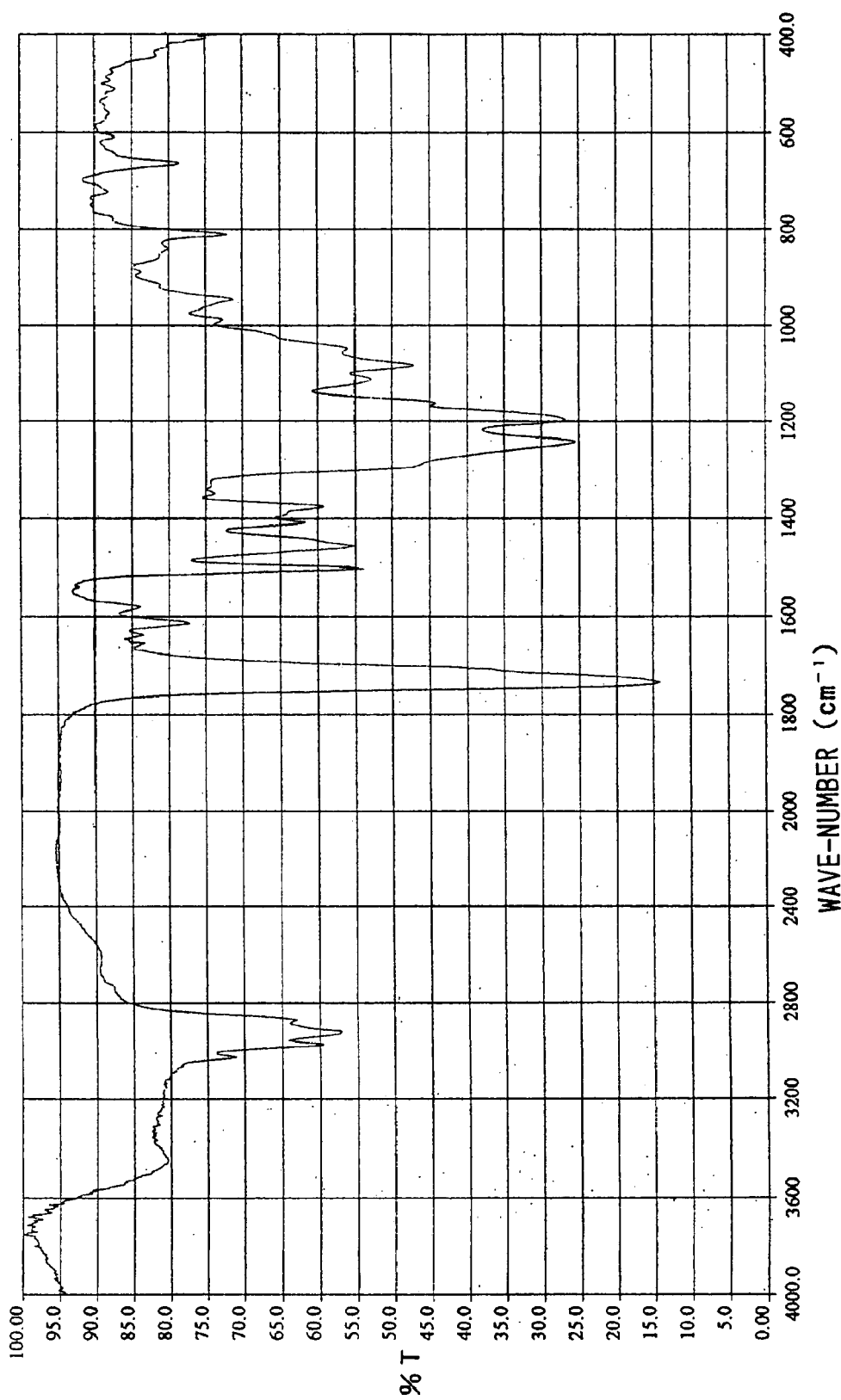
FIG. 1 shows the infrared absorption spectrum of the carboxyl group-containing photosensitive resin obtained in Synthetic Example 1.

The present inventors, after pursuing a diligent study to solve the problems mentioned above, have found that a carboxyl group-containing photosensitive resin (A) obtained by reacting an unsaturated group-containing monocarboxylic acid with a reaction product of a phenolic novolak resin and an alkylene oxide and further reacting a polybasic acid anhydride with the resultant reaction product, particularly a carboxyl group-containing photosensitive resin (A) in which the unsaturated group-containing monocarboxylic acid is acrylic acid and/or methacrylic acid and the polybasic acid anhydride is an alicyclic dibasic acid anhydride, excels in developing properties, photocuring properties, and thermosetting properties and allows the production of a cured product having excellent heat resistance and toughness in combination. The present inventors have further found that a cured product obtained from a photocurable and thermosetting composition containing the aforementioned carboxyl group-containing photosensitive resin (A) together with a photopolymerization initiator (C) and an epoxy resin (D) or further with a photosensitive (meth)acrylate compound (B) has the aforementioned excellent properties required of a resist. As a result, the present invention has been perfected.

Specifically, the carboxyl group-containing photosensitive resin (A) of the present invention has a main chain formed by the chain extension of a phenolic novolak resin caused by an addition reaction of an alkylene oxide thereto and excelling in flexibility and elongation and the subsequent addition of an unsaturated group-containing monocarbxylic acid and the addition of a polybasic acid anhydride take place at end hydroxyl groups caused by the addition reaction of the alkylene oxide. Accordingly, since an unsaturated group and a carboxylic group are not present in the same side chain and located in the terminals of the respective side chains, the resin excels in reactivity, has high heat resistance and toughness, and exhibits excellent alkali-developability owing to the presence of the end carboxyl groups away from the main chain. Furthermore, since the resin has no hydrophilic secondary hydroxyl group of low reactivity unlike the conventionally used resin of epoxy acrylate modified with an acid anhydride, it allows the production of a cured product excelling in water resistance and resistance to chemicals.

Accordingly, the liquid photocurable and thermosetting composition containing the aforementioned carboxyl group-containing photosensitive resin (A) together with a photopolymerization initiator (C) and an epoxy resin (D) or further with a photosensitive (meth)acrylate compound (B) exhibits excellent developing properties, photocuring properties, and thermosetting properties. When its coating film is selectively exposed to light, developed, and finally cured, there is obtained a cured product excelling in adhesiveness, resistance to soldering heat, resistance to moisture absorption, PCT resistance, resistance to electroless gold plating, flexing resistance, folding endurance, flexibility, warpage, and electrical insulating properties.

Now, the carboxyl group-containing photosensitive resin of the present invention and the components of the photocurable and thermosetting composition containing it will be described in detail below.

First, the carboxyl group-containing photosensitive resin (A) of the present invention is obtained by reacting an unsaturated group-containing monocarboxylic acid (d) with a reaction product (c) of a phenolic novolak resin (a) and an alkylene oxide (b) and further reacting a polybasic acid anhydride (f) with the resultant reaction product (e), as mentioned above. Each reaction is easily carried out in a solvent or in the absence of solvent by using a catalyst as described hereinbelow.

It is desirable that such a carboxyl group-containing photosensitive resin (A) should have an acid value in the range of 30 to 150 mg KOH/g, preferably 50 to 120 mg KOH/g. If the acid value of the carboxyl group-containing photosensitive resin is less than 30 mg KOH/g, it will be deficient in solubility in an aqueous alkali solution and the coating film formed therefrom will be developed only with difficulty. Conversely, the acid value exceeding 150 mg KOH/g is not preferred because the coating film will be developed even in the surface of the exposed part without reference to the conditions of the exposure.

The phenolic novolak resin (a) mentioned above is obtained by the condensation reaction of phenols and formaldehyde. Usualy this reaction is carried out in the presence of an acidic catalyst.

As the phenols, phenol, cresol, ethyl phenol, propyl phenol, butyl phenol, hexyl phenol, octyl phenol, nonyl phenol, phenyl phenol, cumyl phenol, etc. may be cited.

The ratio of addition of the alkylene oxide (b) to the phenolic novolak resin (a) mentioned above is preferred to be 0.3 to 10.0 mols per one equivalent of a phenolic hydroxyl group of the phenolic novolak resin (a). If this ratio is less than 0.3 mol, the resultant carboxyl group-containing photosensitive resin will suffer from an undesirable decline in photocuring properties. Conversely, if the ratio exceeds 10.0 mols, the resin will suffer from an undesirable decline in thermosetting properties.

The addition reaction of the alkylene oxide (b) to the phenolic novolak resin (a) is carried out, for example, in the presence of an alkali metal compound such as sodium hydroxide, or a quaternary basic salt compound such as trimethylbenzyl ammonium hydroxide, tametylammonium hydroxide, and tetraetylammonium hydroxide, or a mixture of the alkali metal compound and the quaternary basic salt compound by using an organic solvent such as acetates like ethylene glycol monoethyl ether acetate, ethylene glycol monobutyl ether acetate, diethylene glycol monoethyl ether acetate, diethylene glycol monobutyl ether acetate, propylene glycol monomethyl ether acetate, and dipropylene glycol monomethyl ether acetate, ketones like methyl ethyl ketone, cyclohexanone, and methylisobutyl ketone, and aromatic hydrocarbons like toluene, xylene, and tetramethyl benzene, or a mixed solvent of these compounds, at a temperature in the range of 80 to 180° C. under a pressure in the range of normal pressure to 10 $kg/cm^2$. Particularly, ketones and aromatic hydrocarbons are advantageously used either singly or as a mixed solvent of two or more members.

As the alkylene oxides (b), ethylene oxide, propylene oxide, trimethylene oxide, tetrahydrofuran, tetrahydropyran, etc. may be cited.

The reaction temperature of the esterification reaction of the reaction product (c) of the phenolic novolak resin (a) and the alkylene oxide (b) with the unsaturated group-containing monocarboxylic acid (d) is preferred to be in the approximate range of 50 to 150° C. The reaction may proceed under reduced pressure, under normal pressure, and under pressure as well. As a reaction solvent, n-hexane, cyclohexane, methylcyclohexane, benzene, toluene, xylene, trichloroethane, tetrachloroethylene, methyl chloroform, diisopropyl ether, and acetates such as ethylene glycol monoethyl ether acetate, ethylene glycol monobutyl ether acetate, diethylene glycol monoethyl ether acetate, diethylene glycol monobutyl ether acetate, propylene glycol monomethyl ether acetate, and dipropylene glycol monomethyl ether acetate may be advantageously used. These solvents may be used either singly or in the form of a mixture of two or more members. As the esterification catalysts, sulfuric acid, hydrochloric acid, phosphoric acid, boron fluoride, methanesulfonic acid, benzenesulfonic acid, p-toluenesulfonic acid, cation exchange resins, etc. may be suitably used. The esterification reaction is preferred to be carried out in the presence of a polymerization inhibitor. As the polymerization inhibitors, hydroquinone, methylhydroquinone, hydroquinone monomethyl ether, catechol, pyrogallol, etc. may be advantageously used.

As typical examples of the unsaturated group-containing monocarboxylic acids (d) mentioned above, acrylic acid, methacrylic acid, crotonic acid, cinnamic acid, α-cyanocinnamic acid, β-styrylacrylic acid, β-furfuryl acrylic acid, etc. may be cited. Among other unsaturated group-containing monocarboxylic acids cited above, acrylic acid and/or methacrylic acid prove to be desirable from the viewpoint of the influence on the photochemical reactivity and the properties of the cured product, particularly heat resistance, resistance to moisture absorption, and electrical insulating properties. These unsaturated group-containing monocarboxylic acids may be used either singly or in the form of a mixture of two or more members.

The carboxyl group-containing photosensitive resin (photosensitive prepolymer) of the present invention is obtained by reacting a polybasic acid anhydride (f) with the reaction product (e) of the unsaturated group-containing monocarboxylic acid (d) and the aforementioned reaction product (c). In this reaction, the amount of use of the polybasic acid anhydride (f) is preferred to be in such an addition proportion that the acid value of the produced carboxyl group-containing photosensitive resin (A) falls in the range of 30 to 150 mg KOH/g, preferably 50 to 120 mg KOH/g. The reaction is performed in the presence or absence of an organic solvent to be described hereinafter and in the presence of a polymerization inhibitor such as hydroquinone and oxygen, usually at a temperature in the approximate range of 50 to 150° C. In this reaction, as occasion demands, a tertiary amine such as triethylamine, a quaternary ammonium salt such as triethylbenzyl ammonium chloride, an imidazole compound such as 2-ethyl-4-methylimidazole, and a phosphorus compounds such as triphenyl phosphine may be added to the reaction mixture as a catalyst.

As the polybasic acid anhydrides (f) mentioned above, alicyclic dibasic acid anhydrides such as methyltetrahydrophthalic anhydride, tetrahydrophthalic anhydride, hexahydrophthalic anhydride, methylhexahydrophthalic anhydride, nadic anhydride, 3,6-endomethylenetetrahydrophthalic anhydride, methylendomethylenetetrahydrophthalic anhydride, and tetrabromophthalic anhydride; aliphatic or aromatic dibasic acid anhydrides such as succinic anhydride, maleic anhydride, itaconic anhydride, octenylsuccinic anhydride, pentadodecenylsuccinic anhydride, phthalic anhydride, and trimellitic anhydride; and aliphatic or aromatic tetrabasic acid dianhydrides such as biphenyl-tertacarboxylic dianhydride, diphenyl ether-tertacarboxylic dianhydride, butane-tertacarboxylic dianhydride, cyclopentane-tertacarboxylic dianhydride, pyromellitic anhydride, and benzophenone-tetracarboxylic dianhydride may be cited. These polybasic acid anhydrides may be used either singly or in the form of a combination of two or more members. Among other polybasic acid anhydrides cited above, alicyclic dibasic acid anhydrides prove to be particularly desirable.

Further, another carboxyl group-containing photosensitive resin, for example a photosensitive resin obtained by addition of an acid anhydride to the reaction product of a novolak type and/or bisphenol type epoxy compound with an unsaturated monobasic acid and the like may be mixed with the carboxyl group-containing photosensitive resin of the present invention for the purpose of improving the properties thereof.

As the photosensitive (meth)acrylate compound (B) mentioned above, any photosensitive (meth)acrylate compound having one or more (meth)acryloyl groups in its molecule and assuming a liquid state, solid state, or semi-solid state at normal room temperature may be used. The photosensitive (meth)acrylate compound is used for the purpose of exalting the photochemical reactivity of the composition. The photosensitive (meth)acrylate compound which is in a liquid state at normal room temperature will play the role of adjusting the composition to such a degree of viscosity suitable for a varying method of application and aiding in enhancing the solubility of the composition in an aqueous alkali solution besides the purpose of exalting the photochemical reactivity of the composition. However, the use of the photosensitive (meth)acrylate compound assuming a liquid state at normal room temperature in a large amount is not preferred, because the produced coating film does not easily acquire necessary finger-touch dryness and tends to have their properties degraded. The amount of the photosensitive (meth)acrylate compound (B) to be incorporated into the composition is preferred to be not more than 50 parts by weight, based on 100 parts by weight (as a solid content, this holds good for the same expression to be described hereinafter) of the aforementioned carboxyl group-containing photosensitive resin (A).

As the photosensitive (meth)acrylate compounds (B), hydroxyl group-containing acrylates such as 2-hydroxyethyl acrylate, 2-hydroxypropyl acrylate, pentaerythritol triacrylate, and dipentaerythritol pentaacrylate; water-soluble acrylates such as polyethylene glycol diacrylate and polypropylene glycol diacrylate; polyfunctional polyester acrylates such as trimethylolpropane triacrylate, pentaerythritol tetraacrylate, and dipentaerythritol hexaacrylate; acrylates of ethylene oxide adducts and/or propylene oxide adducts of polyhydric alcohols such as trimethylolpropane and hydrogenated bisphenol A or polyhydric phenols such as bisphenol A and biphenol; polyfunctional or monofunctional polyurethane acrylates which are aforementioned hydroxyl group-containing acrylates modified with isocyanate; epoxy acrylates which are (meth)acrylic acid adducts of bisphenol A diglycidyl ether, hydrogenated bisphenol A diglycidyl ether or phenol novolak epoxy resin, and methacrylates corresponding to the acrylates enumerated above may be cited. These compounds may be used either singly or in combination of two or more members. Among other compounds cited above, polyfunctional (meth)acrylate compounds having two or more (meth)acryloyl groups in their molecules prove to be particularly desirable.

As the photopolymerization initiators (C), for example, benzoin and alkyl ethers thereof such as benzoin, benzoin methyl ether, benzoin ethyl ether, and benzoin isopropyl ether; acetophenones such as acetophenone, 2,2-dimethoxy-2-phenyl acetophenone, 2,2-diethoxy-2-phenyl acetophenone, and 1,1-dichloroacetophenone; aminoacetophenones such as 2-methyl-1-[4-(methylthio)phenyl]-2-morpholinopropanone-1,2-benzyl-2-dimethylamino-1-(4-morpholinophenyl)-butane-1-one, and N,N-dimethylamino-acetophenone; anthraquinones such as 2-methyl-anthraquinone, 2-ethylanthraquinone, 2-t-butylanthraquinone, and 1-chloroanthraquinone; thioxanthones such as 2,4-dimethylthioxanthone, 2,4-diethylthioxanthone, 2-chlorothioxanthone, and 2,4-diisopropylthioxanthone; ketals such as acetophenone dimethyl ketal and benzyl dimethyl ketal; organic peroxides such as benzoyl peroxide and cumene peroxide; dimer of 2,4,5-triaryl imidazole, riboflavin tetrabutylate, thiol compounds such as 2-mercaptobenzimidazole, 2-mercaptobenzoxazole, and 2-mercaptobenzothiazole; 2,4,6-tris-S-triazine; organic halogen compounds such as 2,2,2-tribromoethanol and tribromomethyl phenyl sulfone; benzophenones such as benzophenone and 4,4'-bis(diethylamino)benzophenone or xanthones; 2,4,6-trimethylbenzoyl diphenyl phosphine oxide etc. may be cited. These well known and widely used photopolymerization initiators may be used either singly or in the form of a mixture of two or more members, or further in combination with a photo-initiator aid such as tertiary amines like N,N-(dimethylamino)ethylbenzoate, N,N-(dimethylamino) isoamylbenzoate, penthyl-4-dimethylaminobenzoate, triethylamine, and triethanol amine. Further, a titanothene compound such as CGI-784 (product of Ciba Specialty Chemicals Inc.) and the like which exhibit absorption in a visible region may be added to promote the photochemical reaction. Particularly preferred photopolymerization initiator is 2-methyl-1-[4-(methylthio)phenyl]-2-morpholinopropanone-1, 2-benzyl-2-dimethylamino-1-(4-morpholinophenyl)-butane-1-one, etc., but not limited to these compounds. Any compounds which absorb light in the ultraviolet region or visible region and cause radical polymerization of the unsaturated groups such as (meth)acryloyl groups may be used either singly or in the form of a combination of two or more members irrespective of the photopolymerization initiator or the photo-initiator aid. The amount of the photopolymerization initiator to be used suitably falls in the range of 0.5 to 25 parts by weight, based on 100 parts by weight of the aforementioned carboxyl group-containing photosensitive resin (A).

Concrete examples of the aforementioned epoxy resin (D) include bisphenol A type epoxy resins represented by EPIKOTE 828, EPIKOTE 834, EPIKOTE 1001, and EPIKOTE 1004 produced by Japan Epoxy Resin K.K., EPICLON 840, EPICLON 850, EPICLON 1050, and EPICLON 2055 produced by Dainippon Ink and Chemicals Inc., Epo Tohto YD-011, YD-013, YD-127, and YD-128 produced by Tohto Kasei Co., Ltd., D.E.R. 317, D.E.R. 331, D.E.R. 661, and D.E.R. 664 produced by The Dow Chemical Company, and Sumi-epoxy ESA-011, ESA-014, ELA-115, and ELA-128 produced by Sumitomo Chemical Co., Ltd. (all trade names); brominated epoxy resins represented by EPIKOTE YL903 produced by Japan Epoxy Resin K.K., EPICLON 152 and EPICLON 165 produced by Dainippon Ink and Chemicals Inc., Epo Tohto YDB-400 and YDB-500 produced by Tohto Kasei Co., Ltd., D.E.R. 542 produced by The Dow Chemical Company, and Sumi-epoxy ESB-400 and ESB-700 produced by Sumitomo Chemical Co., Ltd. (all trade names); novolak type epoxy resins represented by EPIKOTE 152 and EPIKOTE 154 produced by Japan Epoxy Resin K.K., D.E.N. 431 and D.E.N. 438 produced by The Dow Chemical Company, EPICLON N-730, EPICLON N-770, and EPICLON N-865 produced by Dainippon Ink and Chemicals Inc., Epo Tohto YDCN-701 and YDCN-704 produced by Tohto Kasei Co., Ltd., EPPN-201, EOCN-1025, EOCN-1020, EOCN-104S, and RE-306 produced by Nippon Kayaku Co., Ltd., and Sumi-epoxy ESCN-195X and ESCN-220 produced by Sumitomo Chemical Co., Ltd. (all trade names); bisphenol F type epoxy resins represented by EPICLON 830 produced by Dainippon Ink and Chemicals Inc., EPIKOTE 807 produced by Japan Epoxy Resin K.K., and Epo Tohto YDF-170, YDF-175, and YDF-2004 produced by Tohto Kasei Co., Ltd. (all trade names); hydrogenated bisphenol A type epoxy resins represented by Epo Tohto ST-2004, ST-2007, and ST-3000 produced by Tohto Kasei Co., Ltd. (all trade names); glycidylamine type epoxy resins represented by EPIKOTE 604 produced by Japan Epoxy Resin K.K., Epo Tohto YH-434 produced by Tohto Kasei Co., Ltd., and Sumi-epoxy ELM-120 produced by Sumitomo Chemical Co., Ltd. (all trade names); alicyclic epoxy resins represented by Celloxide 2021 (trade name) produced by Daicel Chemical Industries, Ltd.; trihydroxyphenyl methane type epoxy resins represented by YL-933 produced by Japan Epoxy Resin K.K. and EPPN-501 and EPPN-502 produced by Nippon Kayaku Co., Ltd. (all trade names); bixylenol type or biphenol type epoxy resins or mixtures thereof represented by YL-6056, YX-4000, and YL-6121 produced by Japan Epoxy Resin K.K. (all trade names); bisphenol S type epoxy resins represented by EBPS-200 produced by Nippon Kayaku Co., Ltd., EPX-30 produced by Asahi Denka Kogyo K.K., and EXA-1514 produced by Dainippon Ink and Chemicals Inc. (all trade names); bisphenol A novolak type epoxy resins represented by EPIKOTE 157S (trade name) produced by Japan Epoxy Resin K.K.; tetraphenylol ethane type epoxy resins represented by EPIKOTE YL-931 (trade name) produced by Japan Epoxy Resin K.K.; heterocyclic epoxy resins represented by TEPIC (trade name) produced by Nissan Chemical Industries Ltd.; diglycidyl phthalate resin represented by BLEMMER-DGT (trade name) produced by Nippon Oil and Fats Co., Ltd.; tetraglycidyl xylenoyl ethane resins represented by ZX-1063 (trade name) produced by Tohto Kasei Co., Ltd.; naphthalene group-containing epoxy resins represented by ESN-190 and ESN-360 produced by Shinnittetsu Chemical Co., Ltd. and HP-4032, EXA-4750, and EXA-4700 produced by Dainippon Ink and Chemicals Inc. (all trade names); dicyclopentadiene skeleton-containing epoxy resins represented by HP-7200 and HP-7200H produced by Dainippon Ink and Chemicals Inc. (all trade names); glycidylmethacrylate copolymer type epoxy resins represented by CP-50S and CP-50M produced by Nippon Oil and Fats Co., Ltd. (all trade names); hydantoin type epoxy resins, and copolymeric epoxy resin of cyclohexyl-maleimide and glycidyl methacrylate, but are not limited to these epoxy resins. These epoxy resins may be used either singly or in the form of a combination of two or more members. Among other epoxy resins cited above, biphenol type or bixylenol type epoxy resins or mixtures thereof prove to be particularly desirable.

The epoxy resins (D) mentioned above contribute to the improvement in such properties as adhesiveness and heat resistance of the resist through their thermal cure. The sufficient amount of the epoxy resin to be incorporated in the composition is in the range of not less than 10 parts by weight and not more than 70 parts by weight, preferably 15 to 60 parts by weight, based on 100 parts by weight of the aforementioned carboxyl group-containing photosensitive resin (A). If the amount of the epoxy resins (D) to be incorporated is below the above range, the hygroscopicity of the cured film will tend to become so high that the PCT resistance will be degraded and the resistance to soldering heat and resistance to electroless plating will be degraded. Conversely, if the amount exceeds the above range, the developing properties of the coating film and the resistance to electroless plating of the cured film will be degraded and the PCT resistance will also be degraded.

The photocurable and thermosetting composition of the present invention may incorporate an organic solvent (E) therein for the purpose of dissolving the carboxyl group-containing photosensitive resin (A) and the photosensitive (meth)acrylate compound (B) mentioned above and adjusting the viscosity of the composition to a level suitable for the coating method. As the organic solvents, for example, ketones such as methylethyl ketone and cyclohexanone; aromatic hydrocarbons such as toluene, xylene, and tetramethyl benzene; glycol ethers such as ethylene glycol monoethyl ether, ethylene glycol monomethyl ether, ethylene glycol monobutyl ether, diethylene glycol monoethyl ether, diethylene glycol monomethyl ether, diethylene glycol monobutyl ether, propylene glycol monomethyl ether, propylene glycol monoethyl ether, dipropylene glycol diethyl ether, and triethylene glycol monoethyl ether; acetates such as ethyl acetate, butyl acetate, ethylene glycol monoethyl ether acetate, ethylene glycol monobutyl ether acetate, diethylene glycol monoethyl ether acetate, diethylene glycol monobutyl ether acetate, propylene glycol monomethyl ether acetate, and dipropylene glycol monomethyl ether acetate; alcohols such as ethanol, propanol, ethylene glycol, and a propylene glycol; aliphatic hydrocarbons such as octane and decane; and petroleum solvents such as petroleum ether, petroleum naphtha, hydrogenated petroleum naphtha, and solvent naphtha may be cited. These organic solvents may be used either singly or in the form of a mixture of two or more members. Incidentally, the organic solvent may be used in an arbitrary amount depending on the kind of method adopted for the application of the composition.

Preferably the photocurable and thermosetting composition of the present invention contains a curing catalyst (F) for the purpose of promoting the thermal curing properties thereof. As the curing catalysts (F), for example, imidazole and imidazole derivatives such as 2-methylimidazole, 2-ethylimidazole, 2-ethyl-4-methylimidazole, 2-phenylimidazole, 4-phenylimidazole, 1-cyanoethyl-2-phenylimidazole, and 1-(2-cyanoethyl)-2-ethyl-4-methylimidazole; amine compounds such as dicyandiamide, benzyldimethyl amine, 4-(dimethylamino)-N,N-dimethylbenzyl amine, 4-methoxy-N,N-dimethylbenzyl amine, 4-methyl-N,N-dimethylbenzyl amine; hydrazine compounds such as hydrazide adipate and hydrazide sebacate; and phosphorus compound such as triphenylphosphine may be used. The curing catalysts which are commercially available include products of Shikoku Chemicals Co., Ltd., 2MZ-A, 2MZ-OK, 2PHZ, 2P4BHZ, and 2P4MHZ (invariably trade names for imidazole type compounds) and products of Sun-Apro K.K., U-CAT3503X and U-CAT3502X (invariably trade names for isocyanate compounds blocked with dimethyl amine) and DBU, DBN, U-CATSA102, and U-CAT5002 (invariably trade names for dicyclic amizine compounds and salts thereof), for example. The curing catalysts are not limited to the compounds cited above and any curing catalysts for epoxy resin and any compounds which can promote the reaction of epoxy groups with carboxyl groups may be used. The curing catalysts may be used either singly or in the form of a mixture of two or more members. Furthermore, S-triazine derivatives which also act as an adhesiveness-imparting agent, such as guanamine, acetoguanamine, benzoguanamine, melamine, 2,4-diamino-6-methacryloyloxyethyl-S-triazine, 2-vinyl-2,4-diamino-S-triazine, isocyanuric acid adduct of 2-vinyl-4,6-diamino-S-triazine, isocyanuric acid adduct of 2,4-diamino-6-methacryloyloxyethyl-S-triazine can also be used, preferably in combination with the curing catalysts mentioned above. The amount of the curing catalyst mentioned above to be incorporated in the composition may be in the conventionally used range, for example, in the range of 0.1 to 20 parts by weight, preferably 0.5 to 15.0 parts by weight, based on 100 parts by weight of the carboxyl group-containing photosensitive resin (A) mentioned above.

The photocurable and thermosetting composition of the present invention may further incorporate therein, as occasion demands, a well known and widely used inorganic filler such as barium sulfate, barium titanate, silicon oxide powder, finely pulverized silicon oxide, amorphous silica, crystalline silica, fused silica, spherical silica, talc, clay, magnesium carbonate, calcium carbonate, aluminum oxide, aluminum hydroxide, and mica singly or in the combination of two or more members. These fillers are used for the purpose of suppressing the shrinkage of a coating film on curing and enhancing the characteristics of the composition such as adhesiveness and hardness. The suitable amount of the inorganic filler to be incorporated in the composition is in the range of 10 to 300 parts by weight, preferably 30 to 200 parts by weight, based on 100 parts by weight of the carboxyl group-containing photosensitive resin (A) mentioned above.

The composition of the present invention may further incorporate therein, as occasion demands, any of known and commonly used coloring agents such as phthalocyanine blue, phthalocyanine green, iodine green, disazo yellow, crystal violet, titanium oxide, carbon black, and naphthalene black, any of known and commonly used thermal polymerization inhibitors such as hydroquinone, hydroquinone monomethyl ether, tert-butyl catechol, pyrogallol, and phenothiazine, any of known and commonly used thickening agents such as finely powdered silica, organobentonite, and montmorillonite, silicone type, fluorine type, or macromolecular type anti-foaming agents and/or leveling agents, silane coupling agents such as imidazole-based compound, thiazole-based compound, and triazole-based compound, or any other known and commonly used additives.

The photocurable and thermosetting composition of the present invention having such a composition as described above is adjusted to a level of viscosity suitable for a particular coating method by dilution when necessary, then applied by the technique of screen printing, curtain coating, spray coating, roll coating, or the like to a printed circuit board having a circuit preparatorily formed thereon, and then dried at a temperature in the approximate range of 60 to 100° C., for example, to expel by evaporation the organic solvent contained in the composition to produce a tack-free coating film. The coating film is then exposed to a laser beam by projecting the laser beam directly on the coating film according to a prescribed pattern or selectively exposed to actinic radiation through a photomask having a prescribed exposure pattern and the unexposed area of the coating film is developed with an aqueous alkali solution to form a resist pattern. The resist film formed in the prescribed pattern as described above is finally cured by heating, or by irradiation with active energy rays and subsequent heating, or by heating and subsequent irradiation with active energy rays to give birth to a cured film (cured product) which excels in adhesiveness, resistance to soldering heat, resistance to moisture absorption, PCT resistance, resistance to electroless gold plating, flexing resistance, folding endurance, flexibility, warpage, and electrical insulating properties.

As an aqueous alkali solution mentioned above, aqueous alkali solutions of potassium hydroxide, sodium hydroxide, sodium carbonate, potassium carbonate, sodium phosphate, sodium silicate, ammonia, amines, etc. can be used.

Suitable light sources which are used for the purpose of photocuring the composition are a low-pressure mercury vapor lamp, a medium-pressure mercury vapor lamp, a high-pressure mercury vapor lamp, an ultra-high-pressure mercury vapor lamp, a xenon lamp, and a metal halide lamp, for example. Also, a laser beam may be used as the active energy rays.

Now, the present invention will be more specifically described below with reference to working examples. However, the present invention is not limited to the following examples. Wherever "parts" is mentioned hereinbelow, they invariably refer to those based on weight unless otherwise specified.

Preparation of Carboxyl Group-containing Photosensitive Resins

SYNTHETIC EXAMPLE 1

Into an autoclave equipped with a thermometer, a device for introduction of nitrogen and alkylene oxide, and a stirrer, 109 parts of a cresol novolak resin manufatured by Gunei Chemical Industry Co., Ltd. (trade name "Resitop PSF-2803", OH equivalent: 109), 2.6 parts of an aqueous 50% sodium hydroxide solution, and 100 parts of toluene/methyl isobutyl ketone (weight ratio=2/1) were charged. The air in the system chamber was replaced with nitrogen while stirring the mixture. The temperature of the mixture was then increased to 150° C. by heating and 60 parts of propylene oxide was gradually introduced therein under a gauge pressure of 8 kg/cm$^2$ to cause reaction thereof. The reaction was continued for about 4 hours till the gauge pressure of 0.0 kg/cm$^2$ and then the solution was cooled to room temperature. To this reaction solution, 3.3 parts of an aqueous 36% hydrochloric acid solution was added and mixed therewith to neutralize sodium hydroxide. The resultant neutralized reaction product was diluted with toluene, washed with water three times, subjected to desolvation by an evaporator to obtain an alkylene oxide adduct of cresol novolak resin having the hydroxyl equivalent of 167 g/eq. This means that one mol of the alkylene oxide was added to one equivalent of the phenolic hydroxyl group on average.

Into a reaction vessel equipped with a stirrer, a thermometer, and an air blowing tube, 122 parts of the alkylene oxide adduct of cresol novolak resin obtained as above, 34 parts of acrylic acid, 3.0 parts of p-toluenesulfonic acid, 0.05 part of hydroquinone monomethyl ether, and 100 parts of toluene were charged, stirred while blowing air thereinto, and left reacting for 6 hours at 110° C. From the point that water caused by the reaction was distilled out together with toluene as an azeotropic mixture, the reaction was further continued for 5 hours. Thereafter, the reaction solution was cooled to room temperature. The obtained reaction solution was washed with an aqueous 5% NaCl solution, toluene was distilled out by means of an evaporator, and diethylene glycol monoethyl ether acetate was added to the solution to obtain a novolak type acrylate resin solution having a nonvolatile content of 60%.

Next, 170 parts of the resultant novolak type acrylate resin solution, 0.05 part of hydroquinone monomethyl ether, and 0.2 part of pyridine were charged into a four-necked flask equipped with a stirrer and a reflux condenser. This mixture was heated to 120° C. and made to add 23 parts of tetrahydrophthalic anhydride and they were left reacting for 6 hours. The product was cooled and then extracted from the flask. The carboxyl group-containing photosensitive resin consequently obtained was found to have a nonvolatile content of 64% and an acid value of 67 mg KOH/g as solids. This reaction solution will be referred to hereinafter as "varnish A-1". The infrared absorption spectrum (IR spectrum) of the carboxyl group-containing photosensitive resin obtained is shown in FIG. 1.

SYNTHETIC EXAMPLE 2

Into a reaction vessel equipped with a stirrer, a thermometer, and an air blowing tube, 122 parts of the alkylene oxide adduct of cresol novolak resin having the hydroxyl equivalent of 167 g/eq. and obtained in the same way as in Synthetic Example 1, 26 parts of acrylic acid, 2.0 parts of p-toluenesulfonic acid, 0.05 part of hydroquinone monomethyl ether, and 100 parts of toluene were charged, stirred while blowing air thereinto, and left reacting for 6 hours at 110° C. From the point that water caused by the reaction was distilled out together with toluene as an azeotropic mixture, the reaction was further continued for 5 hours. Thereafter, the reaction solution was cooled to room temperature. The obtained reaction solution was washed with an aqueous 5% NaCl solution, toluene was distilled out by means of an evaporator, and diethylene glycol monoethyl ether acetate was added to the solution to obtain a novolak type acrylate resin solution having a nonvolatile content of 61%.

Next, 179 parts of the resultant novolak type acrylate resin solution, 0.05 part of hydroquinone monomethyl ether, and 0.35 part of pyridine were charged into a four-necked flask equipped with a stirrer and a reflux condenser. This mixture was heated to 120° C. and made to add 41.3 parts of tetrahydrophthalic anhydride and they were left reacting for 6 hours. The product was cooled and then extracted from the flask. The carboxyl group-containing photosensitive resin consequently obtained was found to have a nonvolatile content of 68% and an acid value of 100 mg KOH/g as solids. This reaction solution will be referred to hereinafter as "varnish A-2".

SYNTHETIC EXAMPLE 3

Into an autoclave equipped with a thermometer, a device for introduction of nitrogen and alkylene oxide, and a stirrer, 119.4 parts of a cresol novolak resin manufatured by Showa Highpolymer Co., Ltd. (trade name "Shonol CRG951", OH equivalent: 119.4), 1.19 parts of potassium hydroxide, and 119.4 parts of toluene were charged. The air in the system chamber was replaced with nitrogen while stirring the mixture. The temperature of the mixture was then increased by heating and then 63.8 parts of propylene oxide was gradually added dropwise thereto to cause reaction thereof for 16 hours at 125–132° C. under pressure of 0–4.8 kg/cm$^2$. Thereafter, the reaction solution was cooled to room temperature. To this reaction solution, 1.56 parts of 89% phosphoric acid was added and mixed therewith to neutralize potassium hydroxide, thereby obtaining a propylene oxide reaction solution of cresol novolak resin having a nonvolatile content of 62.1% and the hydroxyl equivalent of 182.2 g/eq. This means that 1.08 mols of the alkylene oxide was added to one equivalent of the phenolic hydroxyl group on average.

Into a reaction vessel equipped with a stirrer, a thermometer, and an air blowing tube, 293.0 parts of the alkylene oxide reaction solution of cresol novolak resin obtained as above, 43.2 parts of acrylic acid, 11.53 parts of methanesulfonic acid, 0.18 part of methylhydroquinone, and 252.9 parts of toluene were charged and left reacting for 12 hours at 110° C. while stirring and blowing air thereinto at the rate of 10 ml/minute. 12.6 parts of water caused by the reaction was distilled out together with toluene as an azeotropic mixture. Thereafter, the reaction solution was cooled to room temperature. The obtained reaction solution was neutralized with 35.35 parts of an aqueous 15% sodium hydroxide solution and washed with water. Thereafter, toluene was distilled out by means of an evaporator while replacing it with 118.1 parts of diethylene glycol monoethyl ether acetate to obtain a novolak type acrylate resin solution.

Figure 2:
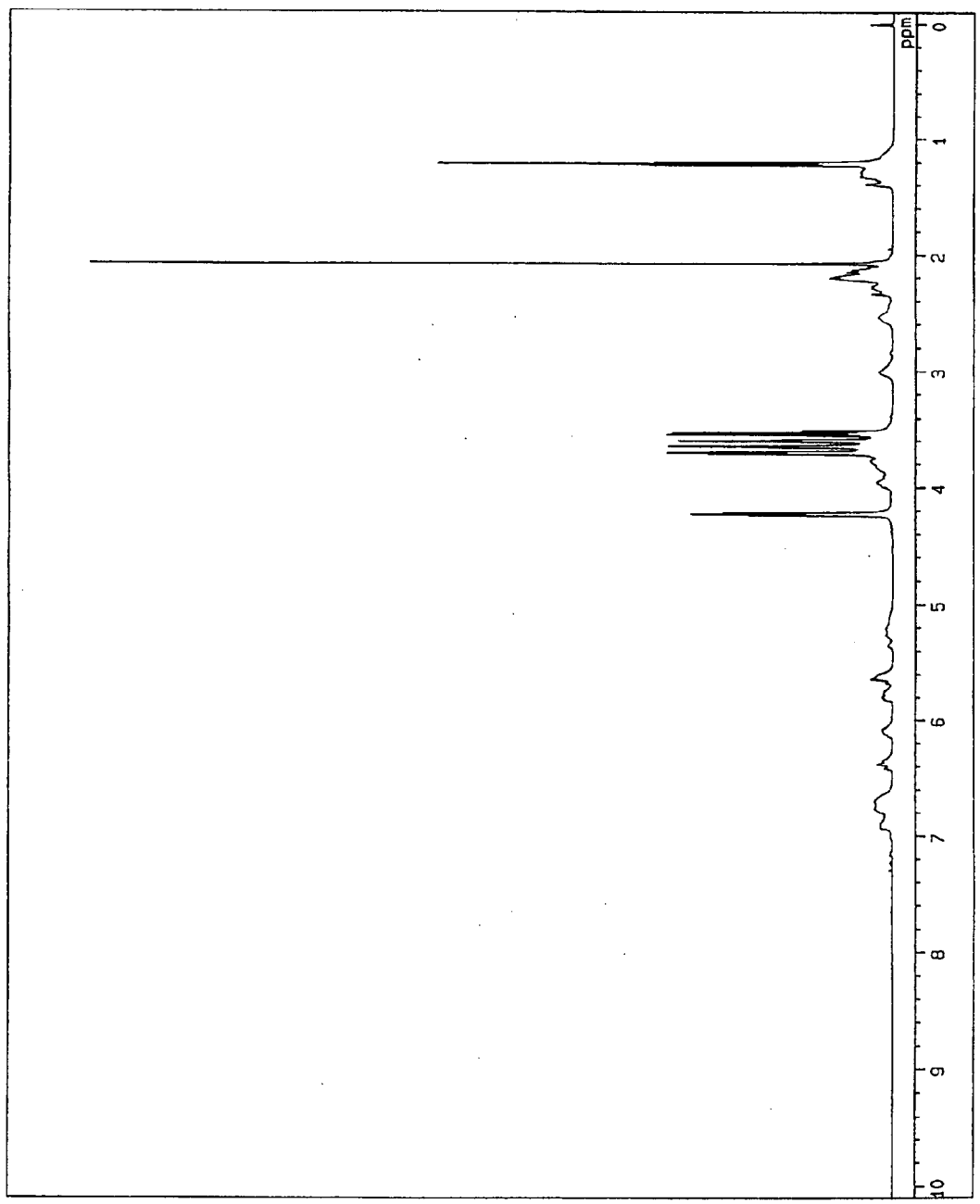
FIG. 2 shows the nuclear magnetic resonance spectrum (solvent: $CDCl_3$, reference substance: TMS (tetramethylsilane)) of the carboxyl group-containing photosensitive resin obtained in Synthetic Example 3.
Figure 3:
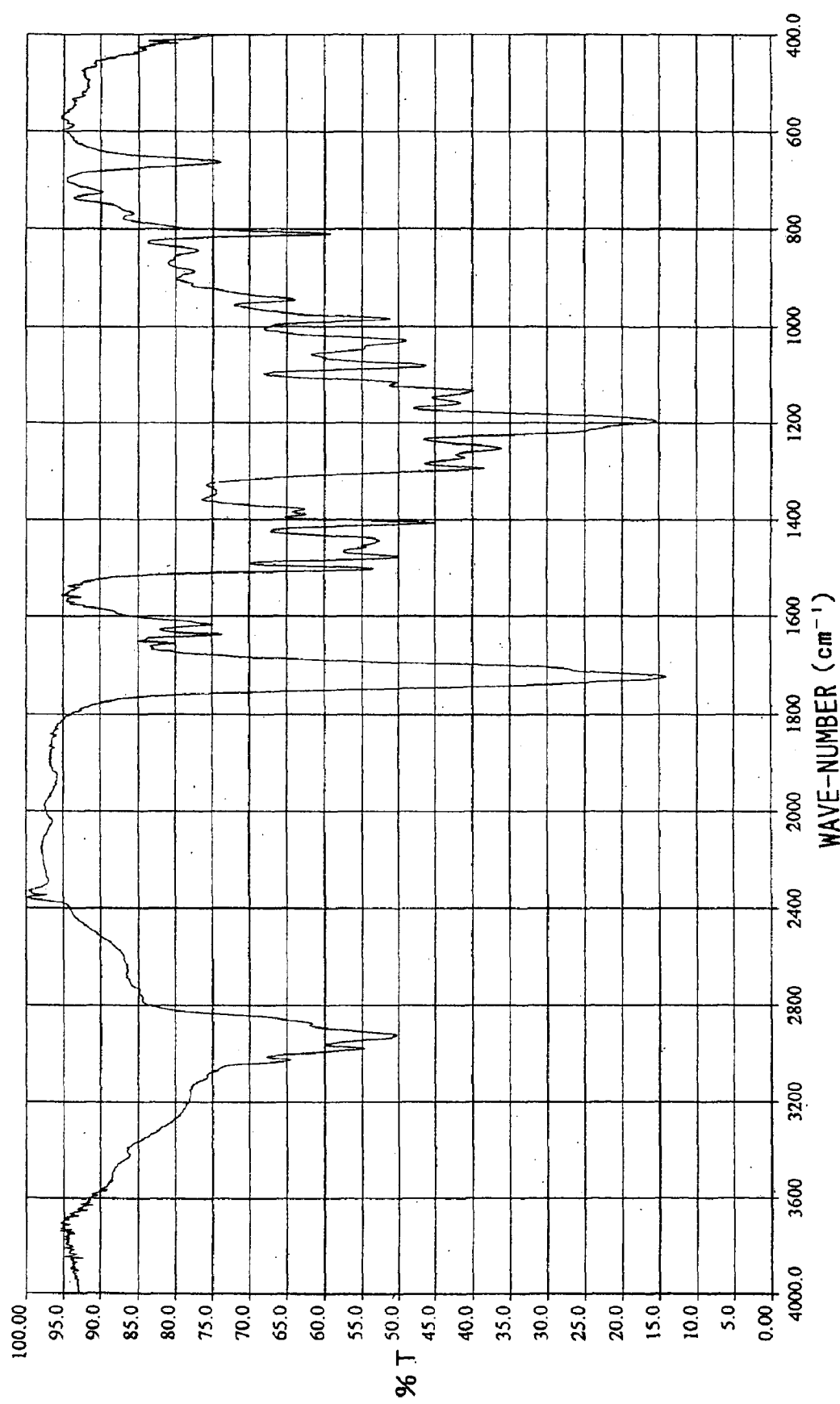
FIG. 3 shows the infrared absorption spectrum of the carboxyl group-containing photosensitive resin obtained in Synthetic Example 3.

Next, 332.5 parts of the resultant novolak type acrylate resin solution and 1.22 parts of triphenylphosphine were charged into a reaction vessel equipped with a stirrer, a thermometer and an air blowing tube. 60.8 parts of tetrahydrophthalic anhydride was gradually added to the mixture while stirring and blowing air thereinto at the rate of 10 ml/minute and left reacting for 6 hours at 95–101° C. The product was cooled and then extracted from the vessel. The carboxyl group-containing photosensitive resin consequently obtained was found to have a nonvolatile content of 70.6% and an acid value of 87.7 mg KOH/g as solids. This resin solution will be referred to hereinafter as "varnish A-3". The $^1$H-NMR spectrum of the carboxyl group-containing photosensitive resin obtained is shown in FIG. 2 and the IR spectrum thereof is shown in FIG. 3.

SYNTHETIC EXAMPLE 4

Into an autoclave equipped with a thermometer, a device for introduction of nitrogen and alkylene oxide, and a stirrer, 109 parts of a cresol novolak resin manufatured by Gunei Chemical Industry Co., Ltd. (trade name "Resitop PSF-2803", OH equivalent: 109), 1.09 parts of potassium hydroxide, and 109 parts of toluene were charged. The air in the system chamber was replaced with nitrogen while stirring the mixture. The temperature of the mixture was then increased by heating and then 348 parts of propylene oxide was gradually added dropwise thereto to cause reaction thereof for 16 hours at 125–132° C. under pressure of 0–4.8 kg/cm$^2$. Thereafter, the reaction solution was cooled to room temperature. To this reaction solution, 1.2 parts of 89% phosphoric acid was added and mixed therewith to neutralize potassium hydroxide, thereby obtaining a propylene oxide reaction solution of cresol novolak resin having a nonvolatile content of 84.3% and the hydroxyl equivalent of 444.8 g/eq. This means that 5.79 mols of the alkylene oxide was added to one equivalent of the phenolic hydroxyl group on average.

Into a reaction vessel equipped with a stirrer, a thermometer, and an air blowing tube, 542.1 parts of the alkylene oxide reaction solution of cresol novolak resin obtained as above, 36 parts of acrylic acid, 9 parts of methanesulfonic acid, 0.2 part of methylhydroquinone, and 382 parts of toluene were charged and left reacting for 12 hours at 110° C. while stirring and blowing air thereinto at the rate of 10 ml/minute. 7.6 parts of water caused by the reaction was distilled out together with toluene as an azeotropic mixture. Thereafter, the reaction solution was cooled to room temperature. The obtained reaction solution was neutralized with 26 parts of an aqueous 15% sodium hydroxide solution and washed with water. Thereafter, toluene was distilled out by means of an evaporator while replacing it with 340 parts of diethylene glycol monoethyl ether acetate to obtain a novolak type acrylate resin solution having a nonvolatile content of 58%.

Figure 4:
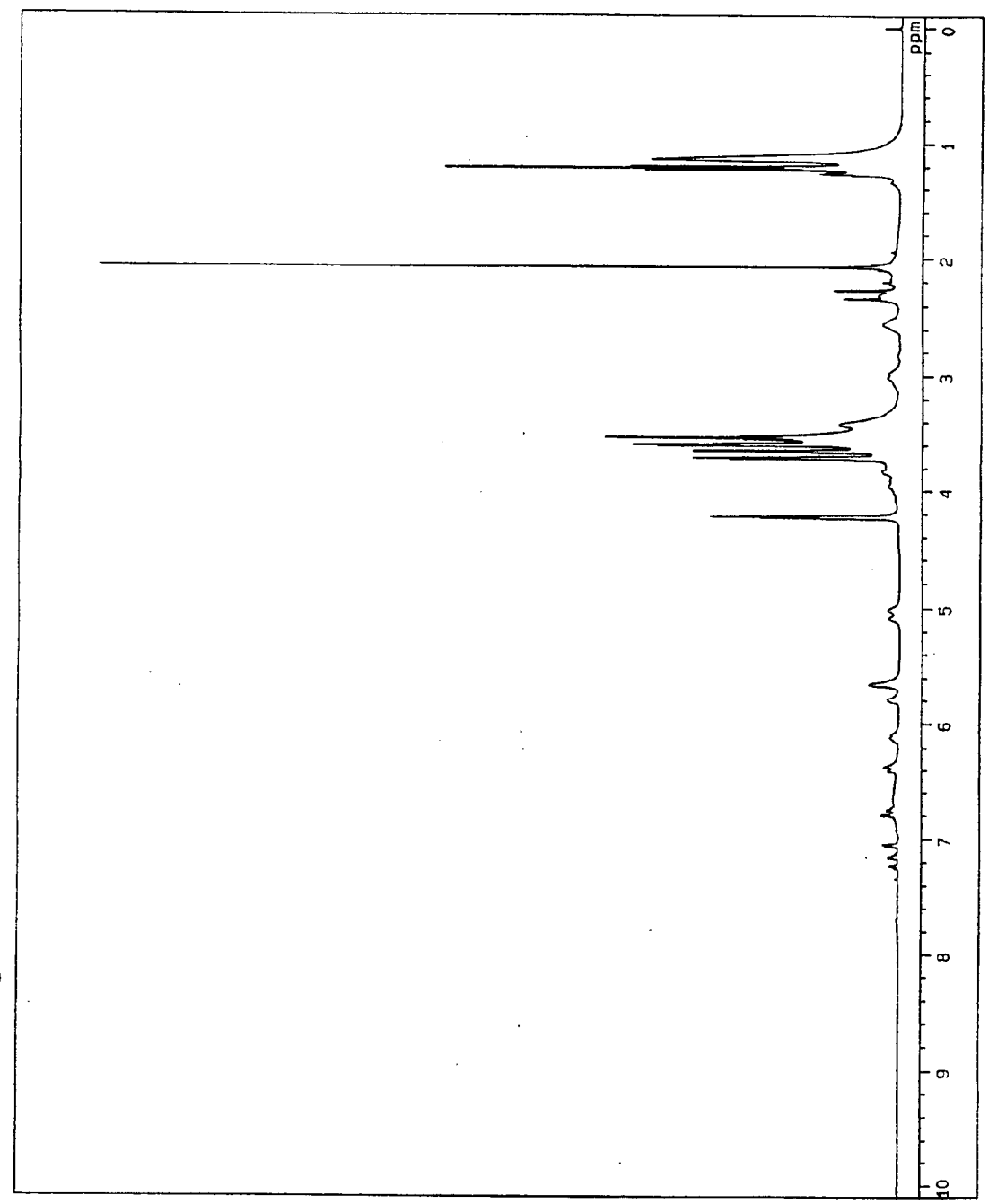
FIG. 4 shows the nuclear magnetic resonance spectrum (solvent: $CDCl_3$, reference substance: TMS (tetramethylsilane)) of the carboxyl group-containing photosensitive resin obtained in Synthetic Example 4.
Figure 5:
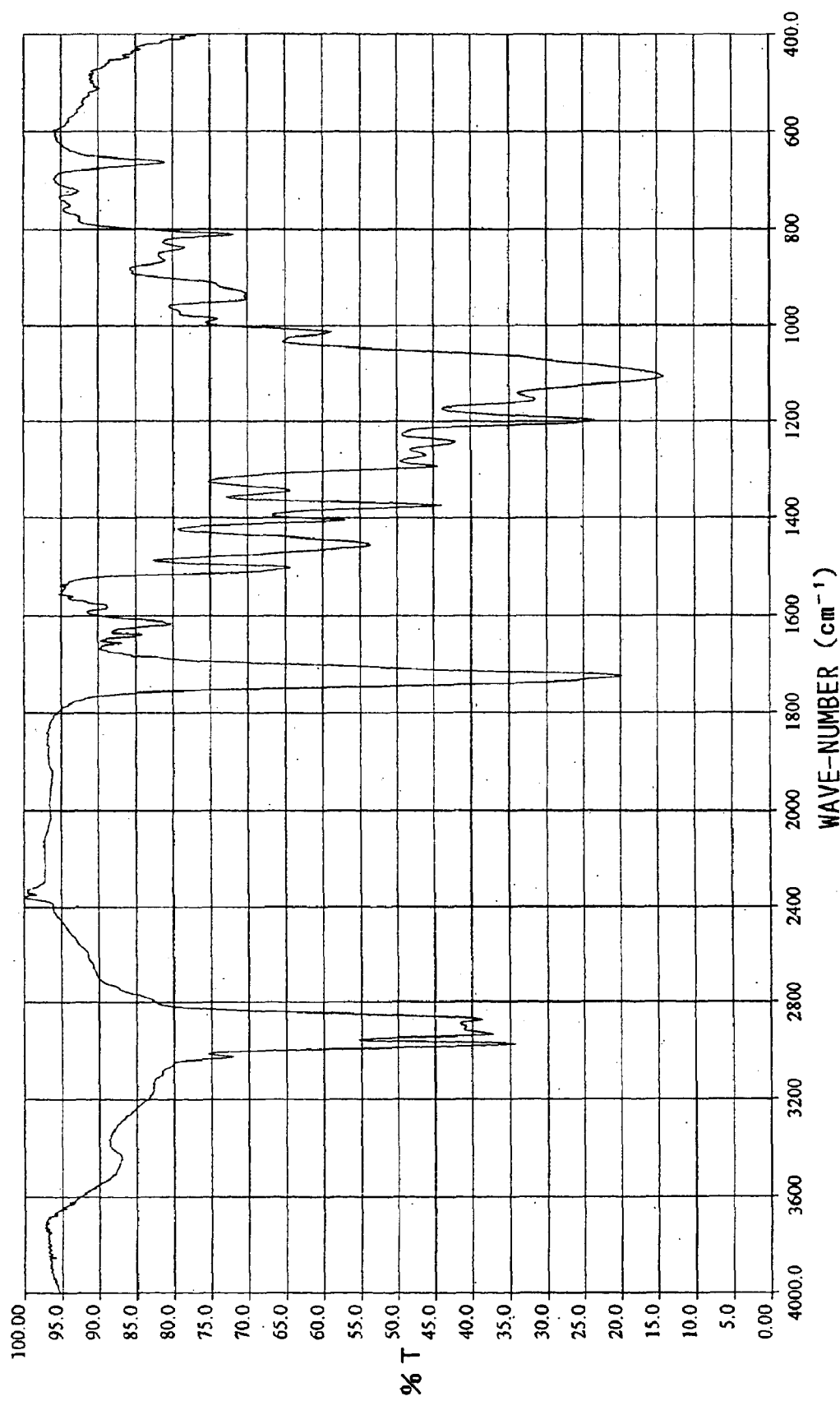
FIG. 5 shows the infrared absorption spectrum of the carboxyl group-containing photosensitive resin obtained in Synthetic Example 4.

Next, 418.5 parts of the resultant novolak type acrylate resin solution and 0.76 part of triphenylphosphine were charged into a reaction vessel equipped with a stirrer, a thermometer and an air blowing tube. 38 parts of tetrahydrophthalic anhydride was gradually added to the mixture while stirring and blowing air thereinto at the rate of 10 ml/minute and left reacting for 3 hours at 107–119° C. The product was cooled and then extracted from the vessel. The carboxyl group-containing photosensitive resin consequently obtained was found to have a nonvolatile content of 63.8% and an acid value of 59.9 mg KOH/g as solids. This resin solution will be referred to hereinafter as "varnish A-4". The $^1$H-NMR spectrum of the carboxyl group-containing photosensitive resin obtained is shown in FIG. 4 and the IR spectrum thereof is shown in FIG. 5.

SYNTHETIC EXAMPLE 5

Into an autoclave equipped with a thermometer, a device for introduction of nitrogen and alkylene oxide, and a stirrer, 150 parts of a cresol novolak resin manufatured by Gunei Chemical Industry Co., Ltd. (trade name "Resitop PSF-2803", OH equivalent: 109), 3.0 parts of an aqueous 50% sodium hydroxide solution, and 150 parts of ethylene glycol monoethyl ether acetate were charged. The air in the system chamber was replaced with nitrogen while stirring the mixture. The temperature of the mixture was then increased to 150° C. by heating and 56 parts of propylene oxide was gradually introduced therein under a gauge pressure of 8 kg/cm$^2$ to cause reaction thereof. The reaction was continued for about 4 hours till the gauge pressure of 0.0 kg/cm$^2$ and then the solution was cooled to room temperature. To this reaction solution, 3.8 parts of an aqueous 36% hydrochloric acid solution was added and mixed therewith to neutralize sodium hydroxide. The resultant neutralized reaction product was diluted with toluene, washed with water three times, subjected to desolvation by an evaporator, and diethylene glycol monoethyl ether acetate was added to the solution to obtain an alkylene oxide adduct of cresol novolak resin having a nonvolatile content of 80% and the hydroxyl equivalent of 149 g/eq. calculated as solid content. This means that 0.7 mol of the alkylene oxide was added to one equivalent of the phenolic hydroxyl group on average.

Into a reaction vessel equipped with a stirrer, a thermometer, and an air blowing tube, 187 parts of the alkylene oxide adduct of cresol novolak resin obtained as above, 25 parts of acrylic acid, 2.0 parts of p-toluenesulfonic acid, 0.02 part of hydroquinone monomethyl ether, and 70 parts of toluene were charged, stirred while blowing air thereinto at the rate of 50 ml/minute, and left reacting for 5 hours at 110° C. From the point that water caused by the reaction was distilled out together with toluene as an azeotropic mixture, the reaction was further continued for 5 hours. The obtained reaction solution was washed with an aqueous 5% NaCl solution, toluene was distilled out by means of an evaporator, and diethylene glycol monoethyl ether acetate was added to the solution to obtain a novolak type acrylate resin solution having a nonvolatile content of 55%.

Next, 238 parts of the resultant novolak type acrylate resin solution, 0.02 part of hydroquinone monomethyl ether, and 1.3 parts of triphenylphosphine were charged into a four-necked flask equipped with a stirrer and a reflux condenser. This mixture was heated to 120° C. and made to add 39 parts of tetrahydrophthalic anhydride and they were left reacting for 6 hours. The product was cooled and then extracted from the flask. The carboxyl group-containing photosensitive resin consequently obtained was found to have a nonvolatile content of 61% and an acid value of 83 mg KOH/g as solids. This reaction solution will be referred to hereinafter as "varnish A-5".

COMPARATIVE SYNTHETIC EXAMPLE 1

In a four-necked flask equipped with a stirrer and a reflux condenser, 220 parts of a cresol novolak type epoxy resin, EPICLON N-695 (product of Dainippon Ink & Chemicals, Inc., epoxy equivalent; 220) and 220 parts of carbitol acetate added thereto were dissolved by heating. Then, 0.46 part of hydroquinone as a polymerization inhibitor and 1.38 parts of triphenylphosphine as a reaction catalyst were added to the solution. The resultant mixture kept heated to 95–105° C. and 72 parts of acrylic acid gradually added dropwise thereto were left reacting for 16 hours. The reaction product was cooled to 80–90° C. and made to add 106 parts of tetrahydrophthalic anhydride and they were left reacting for 8 hours. The product was cooled and then extracted from the flask. The carboxyl group-containing photosensitive resin consequently obtained was found to have a nonvolatile content of 64% and an acid value of 97 mg KOH/g as solids. This reaction solution will be referred to hereinafter as "varnish B-1".

COMPARATIVE SYNTHETIC EXAMPLE 2

In a four-necked flask equipped with a stirrer and a reflux condenser, 220 parts of a cresol novolak type epoxy resin, EOCN-104S (product of Nippon Kayaku Co., Ltd., epoxy equivalent: 220) and 220 parts of carbitol acetate added thereto were dissolved by heating. Then, 0.46 part of methylhydroquinone as a polymerization inhibitor and 1.38 parts of triphenylphosphine as a reaction catalyst were added to the solution. The resultant mixture kept heated to 95–105° C. and 50.4 parts of acrylic acid and 41.5 parts of p-hydroxyphenetyl alcohol gradually added dropwise thereto were left reacting for 16 hours. The reaction product was cooled to 80–90° C. and made to add 116 parts of tetrahydrophthalic anhydride and they were left reacting for 8 hours. The product was cooled and then extracted from the flask. The carboxyl group-containing photosensitive resin consequently obtained was found to have a nonvolatile content of 66% and an acid value of 98 mg KOH/g as solids. This reaction solution will be referred to hereinafter as "varnish B-2".

COMPARATIVE SYNTHETIC EXAMPLE 3

Into a flask equipped with a gas introduction tube, a stirrer, a condenser, and a thermometer, 313 parts of bisphenol A and 987 parts of a bisphenol A type epoxy resin (EPICLON-840 manufactured by Dainippon Ink & Chemicals, Inc., epoxy equivalent: 180) were charged and dissolved at 120° C. while stirring under nitrogen atmosphere. Then, 0.65 part of triphenylphosphine was added to the mixture and the temperature in the flask was increased to 150° C. The reaction was continued for about 90 minutes while keeping the temperature at 150° C. to obtain an epoxy compound having the epoxy equivalent of 475 g/eq. Next, the temperature in the flask was cooled to 70° C. or less, and 1851 parts of epichlorohydrin and 1690 parts of dimethyl sulfoxide were added to the mixture. The mixture was heated to 70° C. while stirring and kept at this temperature. Then, after 110 parts of 96% sodium hydroxide was dividually added to the mixture for 90 minutes, the reaction was continued for further 3 hours. After completion of the reaction, most of excess epichlorohydrin and dimethyl sulfoxide were distilled at 120° C. under a reduced pressure of 50 mmHg. The reaction product containing a by-product salt and dimethyl sulfoxide was dissolved in methyl isobutyl ketone and washed with water. Thereafter, methyl isobutyl ketone was recovered from the oil layer by distillation to obtain a polynuclear epoxy compound having an epoxy equivalent of 336 g/eq. Next, in a flask equipped with a stirrer, a condenser, and a thermometer, 336 parts of the obtained polynuclear epoxy compound and 300 parts of carbitol acetate added thereto were dissolved by heating. Then, 0.46 part of methylhydroquinone and 1.38 parts of triphenylphosphine were added to the solution. The resultant mixture kept heated to 95–105° C. and 72 parts of acrylic acid gradually added dropwise thereto were left reacting for 16 hours. The reaction product was cooled to 80–90° C. and made to add 152 parts of tetrahydrophthalic anhydride and they were left reacting for 8 hours. The product was cooled and then extracted from the flask. The carboxyl group-containing photosensitive resin consequently obtained was found to have a nonvolatile content of 65% and an acid value of 98 mg KOH/g as solids. This reaction solution will be referred to hereinafter as "varnish B-3".

Preparation of Photocurable and Thermosetting Resin Composition

COMPOSITION EXAMPLES 1 TO 5 AND COMPARATIVE COMPOSITION EXAMPLES 1 TO 3

The components accounting for varying ratios of combination shown in Table 1 and using the varnishes obtained in the synthetic examples 1 to 5 and comparative synthetic examples 1 to 3 mentioned above were severally kneaded with a three-roll mill to obtain photocurable and thermosetting resin compositions. The characteristics of these compositions are shown in Table 2.

TABLE 1

| Components (parts by weight) | | Composition Example | | | | | Comparative Composition Example | | |
|---|---|---|---|---|---|---|---|---|---|
| | | 1 | 2 | 3 | 4 | 5 | 1 | 2 | 3 |
| Carboxyl group-containing | A-1 | 156 | — | — | — | — | — | — | — |
| | A-2 | — | 147 | — | — | — | — | — | — |

TABLE 1-continued

|  |  | Composition Example | | | | | Comparative Composition Example | | |
|---|---|---|---|---|---|---|---|---|---|
| Components (parts by weight) | | 1 | 2 | 3 | 4 | 5 | 1 | 2 | 3 |
| photosensitive resin | A-3 | — | — | 142 | — | — | — | — | — |
| | A-4 | — | — | — | 157 | — | — | — | — |
| | A-5 | — | — | — | — | 164 | — | — | — |
| | B-1 | — | — | — | — | — | 156 | — | — |
| | B-2 | — | — | — | — | — | — | 152 | — |
| | B-3 | — | — | — | — | — | — | — | 154 |
| Photopolymerization initiator | Irgacure 907 | 12 | 12 | 12 | 12 | 12 | 12 | 12 | 12 |
| Photosensitive monomer | DPHA | 5 | 5 | 5 | — | 5 | 5 | 5 | 5 |
| Epoxy resin | YX-4000 | 22 | 32 | 29 | 20 | 41 | 31 | 32 | 32 |

Remarks
Irgacure 907: 2-methyl-1-[4-(methylthio)phenyl]-2-morpholino-Propanone-1 (produced by Ciba Specialty Chemicals Inc.)
DPHA: a mixture of dipentaerythritol pentaacrylate and Dipentaerythritol hexaacrylate (produced by Nippon Kayaku Co., Ltd.)
EPIKOTE YX-4000: bixylenol type epoxy resin (produced by Japan Epoxy Resin K.K.)

TABLE 2

|  | Composition Example | | | | | Comparative Composition Example | | |
|---|---|---|---|---|---|---|---|---|
| Properties | 1 | 2 | 3 | 4 | 5 | 1 | 2 | 3 |
| (1) Glass transition point (° C.) | 118 | 123 | 125 | 101 | 130 | 120 | 98 | 90 |
| (2) Tensile modulus (MPa) | 3350 | 3380 | 3040 | 2490 | 3320 | 3500 | 3470 | 3370 |
| (3) Tensile strength (MPa) | 52 | 54 | 56 | 51 | 55 | 35 | 32 | 30 |
| (4) Elongation (%) | 3.7 | 3.3 | 3.5 | 7.7 | 3.8 | 1.0 | 1.9 | 2.3 |
| (5) Folding endurance | ○ | ○ | ○ | ○ | ○ | X | Δ | Δ |
| (6) Flexibility | ○ | ○ | ○ | ○ | ○ | X | Δ | Δ |
| (7) Water absorption (%) | 0.8 | 0.8 | 0.9 | 1.2 | 0.7 | 1.6 | 1.4 | 1.9 |
| (8) Pencil hardness | 3H | 4H | 4H | 2H | 5H | 3H | 2H | HB |
| (9) Resistance to acids | ○ | ○ | ○ | ○ | ○ | ○ | ○ | ○ |
| (10) Resistance to alkalis | ○ | ○ | ○ | ○ | ○ | ○ | Δ | Δ |
| (11) Heat resistance | ○ | ○ | ○ | ○ | ○ | ○ | Δ | Δ |

The characteristics shown in Table 2 were determined by the following methods.

(1) Glass Transition Point:

Each of the compositions of Composition Examples and Comparative Composition Examples mentioned above was applied by the screen printing method to a Teflon (a trademark of E.I. du Pont de Nemours & Co. for polytetrafluoroethylene) sheet washed with water and dried in advance. The composition on the sheet was dried in a hot air circulating drying oven at 80° C. for 40 minutes, left cooling to room temperature, and exposed to light under the conditions of irradiation dose of 1,000 mJ/cm², and then cured in a hot air circulating drying oven at 150° C. for 60 minutes. The sheet covered with the cured composition was cooled to room temperature and the cured film was separated from the Teflon sheet to obtain a test sample. The glass transition point of the test sample was determined by the DMA method.

(2) Tensile Modulus, (3) Tensile Strength (Tensile Strength at Break), (4) Elongation (Tensile Elongation at Break):

The tensile modulus, the tensile strength (tensile strength at break), and the elongation (tensile elongation at break) of the test samples mentioned above were determined by a tensile and compression tester (manufactured by Shimadzu Seisakusho K.K.).

Each of the compositions of Composition Examples and Comparative Composition Examples mentioned above was applied by the screen printing method to a capton sheet (thickness: 25 μm) washed with water and dried in advance, and dried in a hot air circulating drying oven at 80° C. for 40 minutes. The composition on the sheet was left cooling to room temperature and exposed to light under the conditions of irradiation dose of 1,000 mJ/cm², and then cured in a hot air circulating drying oven at 150° C. for 60 minutes to obtain a test sample for the folding endurance test and the flexibility test.

(5) Folding Endurance:

The test sample was folded 180° over itself while positioning the cured film outside and evaluated on the following criterion.

○: Absence of crack in the cured film

Δ: Presence of slight cracks in the cured film

X: Presence of cracks in the cured film (6) Flexibility:

A film test piece was prepared by cutting the cured film into the size of 10 mm in width and 90 mm in length. One side portion of this test piece was placed on an electronic weigher and the other side portion was folded over the one side. By assuming the maximum load applied on the electronic weigher when folded so that the distance between the side portions reaches 3 mm as the repulsion force, the flexibility was evaluated on the following criterion.

○: Less than 10 g

Δ: 10 to <30 g

X: Not less than 30 g (7) Water Absorption:

Each of the compositions of Composition Examples and Comparative Composition Examples mentioned above was applied by the screen printing method to a glass sheet of which weight was measured in advance. The glass sheet covered with the composition was dried in a hot air circulating drying oven at 80° C. for 40 minutes. The composition on the sheet was left cooling to room temperature and exposed to light under the conditions of irradiation dose of 1,000 mJ/cm$^2$, and then cured in a hot air circulating drying oven at 150° C. for 60 minutes to obtain a test sample. The test sample was cooled to room temperature and then weighed. Subsequently, the test sample was treated in a PCT apparatus (TABAI ESPEC HAST SYSTEM TPC-412MD) under the conditions of 121° C., 100% R.H., and the treating time of 24 hours and weighed to find the weight of the hardened product. The water absorption of the hardened product was calculated by the following equation:

Water absorption (%)={$(W_2-W_1)/(W_1-W_g)$}×100 where $W_1$ is the weight of the test sample, $W_2$ is the weight of the test sample after the PCT treatment, and $W_g$ is the weight of the glass sheet.

(8) Pencil Hardness:

This hardness was determined in accordance with method specified in JIS (Japanese Industrial Standard) K 5400.

Each of the compositions of Composition Examples and Comparative Composition Examples mentioned above was applied by the screen printing method to a printed circuit board washed with water and dried in advance, and dried in a hot air circulating drying oven at 80° C. for 40 minutes. The composition on the board was left cooling to room temperature and exposed to light under the conditions of irradiation dose of 1,000 mJ/cm$^2$, and then cured in a hot air circulating drying oven at 150° C. for 60 minutes to obtain a test board for the acid resistance test, the alkali resistance test, and the heat resistance test.

(9) Acid Resistance Test:

This property was determined by keeping the test board mentioned above immersed in an aqueous 10 vol. % sulfuric acid solution at 20° C. for 30 minutes, removing the test board from the solution, and evaluating the test board comprehensively with respect to the coating film condition and adhesion. The criterion for evaluation is as follows:

○: Absence of discernible change

Δ: Very slight presence of change

X: Occurrence of blister or swell or separation of coating film

(10) Alkali Resistance Test:

This property was determined by following the procedure of the acid resistance test except that an aqueous 10 wt. % sodium hydroxide solution was used in place of the aqueous 10 vol. % sulfuric acid solution.

(11) Heat Resistance:

The test board mentioned above was left in a hot air circulating drying oven at 150° C. for 24 hours. Thereafter, the test board was incised like cross-cut in the shape of squares in a go board, 10×10 (100 cells), and then subjected to a peeling test with a tape in accordance with the method specified in JIS K 5600-5-6 to evaluate the resistance to heat deterioration by the adhesiveness. The criterion for evaluation is as follows:

○: 100/100 (Absolutely no peeling of the film)

Δ: 99/100-70/100 (Slight peeling of the film)

X: 69/100 or less (Considerable peeling of the film)

It is clearly noted from the results shown in Table 2 that the cured products of the compositions obtained by using the carboxyl group-containing photosensitive resin of the present invention excelled not only in heat resistance and toughness (tensile modulus, tensile strength) but also in such properties as elongation, flexibility (folding endurance, suppleness), water absorption, hardness, and resistance to chemicals. On the contrary, the cured products of the compositions obtained by using the carboxyl group-containing photosensitive resins of the comparative examples were deficient in tensile strength, flexibility (folding endurance, suppleness), elongation, and resistance to moisture (water absorption).

COMPOSITION EXAMPLES 6 TO 10 AND COMPARATIVE COMPOSITION EXAMPLES 4 TO 6

The photocurable and thermosetting resin compositions shown in Table 3 were prepared by compounding relevant components at proportions shown in Table 3 and kneading them with a three-roll mill, respectively.

TABLE 3

| Components (parts by weight) | | Composition Example | | | | | Comparative Composition Example | | |
|---|---|---|---|---|---|---|---|---|---|
| | | 6 | 7 | 8 | 9 | 10 | 4 | 5 | 6 |
| Carboxyl group-containing photosensitive resin | A-1 | 156 | — | — | — | — | — | — | — |
| | A-2 | — | 147 | — | — | — | — | — | — |
| | A-3 | — | — | 142 | — | — | — | — | — |

TABLE 3-continued

|  | Composition Example | | | | | Comparative Composition Example | | |
|---|---|---|---|---|---|---|---|---|
| Components (parts by weight) | 6 | 7 | 8 | 9 | 10 | 4 | 5 | 6 |
| A-4 | — | — | — | 157 | — | — | — | — |
| A-5 | — | — | — | — | 164 | — | — | — |
| B-1 | — | — | — | — | — | 156 | — | — |
| B-2 | — | — | — | — | — | — | 152 | — |
| B-3 | — | — | — | — | — | — | — | 154 |
| Irgacure 907 | 12 | 12 | 12 | 12 | 12 | 12 | 12 | 12 |
| Diethylene glycol monoethyl ether acetate | 5 | 7 | 4 | 6 | 9 | 5 | 7 | 7 |
| Silicone KS-66 | 3 | 3 | 3 | 3 | 3 | 3 | 3 | 3 |
| Barium sulfate | 50 | 50 | 50 | 50 | 50 | 50 | 50 | 50 |
| AEROSIL 380 | 5.0 | 5.0 | 5.0 | 5.0 | 5.0 | 5.0 | 5.0 | 5.0 |
| Phthalocyanine green | 1.5 | 1.5 | 1.5 | 1.5 | 1.5 | 1.5 | 1.5 | 1.5 |
| Dicyandiamide | 1.0 | 1.0 | 1.0 | 1.0 | 1.0 | 1.0 | 1.0 | 1.0 |
| DPHA | 20 | 20 | 20 | 20 | 20 | 20 | 20 | 20 |
| YX-4000 | 21 | 32 | 29 | 20 | 41 | 31 | 32 | 32 |

Remarks
Irgacure 907: 2-methyl-1-[4-(methylthio)phenyl]-2-morpholino-propanone-1 (produced by Ciba Specialty Chemicals Inc.)
Silicone KS-66: Silicone type anti-foaming agent (produced by Shinetsu Chemical Industry Co., Ltd)
AEROSIL 380: anhydrous silica (produced by Nippon Aerosil Co., Ltd.)
DPHA: a mixture of dipentaerythritol pentaacrylate and Dipentaerythritol hexaacrylate (produced by Nippon Kayaku Co., Ltd.)
EPIKOTE YX-4000: bixylenol type epoxy resin (produced by Japan Epoxy Resin K.K.)

Each of the photocurable and thermosetting compositions of Composition Examples 6–10 and Comparative Composition Examples 4–6 mentioned above was applied by the screen printing method using a polyester screen of 100 mesh to the entire surface of a copper plated-throughhole printed circuit board having a prescribed pattern formed in advance thereon to form a coating film of 20–30 μm thickness. The coating film on the board was dried in a hot air circulating drying oven at 80° C. for a prescribed duration. The coating film was irradiated with ultraviolet light by using an exposure apparatus (product of ORC Manufacturing Co., Ltd., Model HMW-680GW) through a negative film having a prescribed resist pattern and tightly superposed on the coating film (irradiation dose: 350 mJ/cm$^2$). Then, the coating film was developed for 60 seconds with an aqueous 1% sodium carbonate solution applied by spraying at a pressure of 2.0 kg/cm$^2$ to dissolve out the unexposed portion. Thereafter, the coating film on the board was thermally cured in a hot air circulating drying oven at 150° C. for 60 minutes. The resultant test piece having the cured film was tested for the adhesiveness, resistance to soldering heat, PCT resistance, and resistance to electroless gold plating. The testing method and the evaluation method are as follows:

(12) Developability:

For the printed circuit boards which have been dried for 30 minutes, 40 minutes, 50 minutes, 60 minutes, 70 minutes, 80 minutes, or 90 minutes, the conditions of the coating films after exposure and development were visually examined by using a magnifier. The results are shown in Table 4.

○: Development was perfect because the coating film was removed during development.

X: Undeveloped portion having at least slight residue was observed in development.

TABLE 4

| | | Developability | | | | | | |
|---|---|---|---|---|---|---|---|---|
| Drying time at 80° C. (min.) | | 30 | 40 | 50 | 60 | 70 | 80 | 90 |
| Composition Example | 6 | ○ | ○ | ○ | X | — | — | — |
| | 7 | ○ | ○ | ○ | ○ | ○ | X | — |
| | 8 | ○ | ○ | ○ | ○ | ○ | X | — |
| | 9 | ○ | ○ | ○ | ○ | ○ | ○ | ○ |
| | 10 | ○ | ○ | ○ | ○ | ○ | X | — |
| Comparative Composition Example | 4 | ○ | ○ | ○ | X | — | — | — |
| | 5 | ○ | ○ | X | — | — | — | — |
| | 6 | ○ | X | — | — | — | — | — |

(13) Adhesiveness:

The cured film on the test piece was incised like cross-cut in the shape of squares in a go board and then subjected to a peeling test with an adhesive cellophane tape in accordance with the method specified in JIS D 0202. The degree of separation of the cured film after the peeling test was visually examined. The results are shown in Table 5. Incidentally, the test piece which could not be developed was not evaluated.

⊚: 100/100 and absolutely no peeling of the cured film
○: 100/100, but slight peeling in the cross-cut portions
Δ: 50/100–90/100
X: 0/100–50/100

TABLE 5

| | | Adhesiveness | | | | | | |
|---|---|---|---|---|---|---|---|---|
| Drying time at 80° C. (min.) | | 30 | 40 | 50 | 60 | 70 | 80 | 90 |
| Composition Example | 6 | ⊚ | ⊚ | ⊚ | — | — | — | — |
| | 7 | ⊚ | ⊚ | ⊚ | ⊚ | ⊚ | — | — |

TABLE 5-continued

| | | Adhesiveness | | | | | | |
|---|---|---|---|---|---|---|---|---|
| Drying time at 80° C. (min.) | | 30 | 40 | 50 | 60 | 70 | 80 | 90 |
| | 8 | ⊚ | ⊚ | ⊚ | ⊚ | ⊚ | — | — |
| | 9 | ⊚ | ⊚ | ⊚ | ⊚ | ⊚ | ⊚ | ⊚ |
| | 10 | ⊚ | ⊚ | ⊚ | ⊚ | ⊚ | — | — |
| Comparative | 4 | ○ | ○ | ○ | — | — | — | — |
| Composition | 5 | ○ | ○ | — | — | — | — | — |
| Example | 6 | ○ | — | — | — | — | — | — |

(14) Resistance to Soldering Heat:

A test piece was repeatedly immersed in a solder bath kept at 260° C. three times each for 10 seconds in accordance with the method specified in JIS C 6481 and visually examined the change in appearance on the following criterion. The results are shown in Table 6. Incidentally, the test piece which could not be developed was not evaluated. Further, a flux according to JIS C 6481 was used as a post flux (rosin type).

○: No discernible change in appearance
Δ: Discoloration of the cured film observed
X: Lifting or separation of the cured film, or infiltration of solder observed

TABLE 6

| | | Resistance to soldering heat | | | | | | |
|---|---|---|---|---|---|---|---|---|
| Drying time at 80° C. (min.) | | 30 | 40 | 50 | 60 | 70 | 80 | 90 |
| Composition | 6 | ○ | ○ | ○ | — | — | — | — |
| Example | 7 | ○ | ○ | ○ | ○ | ○ | — | — |
| | 8 | ○ | ○ | ○ | ○ | ○ | — | — |
| | 9 | ○ | ○ | ○ | ○ | ○ | ○ | ○ |
| | 10 | ○ | ○ | ○ | ○ | ○ | — | — |
| Comparative | 4 | ○ | ○ | ○ | — | — | — | — |
| Composition | 5 | Δ | Δ | — | — | — | — | — |
| Example | 6 | Δ | — | — | — | — | — | — |

(15) Water Absorption:

A cured film was formed on a ceramic board (alumina board) of which weight was measured in advance, under the same conditions as described above except that the drying time was 40 minutes, and the total weight was measured. This board was immersed in demineralized water of 22° C. for 24 hours and then weighed. The degree of increase in weight was regarded as the water absorption. The results are shown in Table 7.

TABLE 7

| Example No. | | Water absorption (%) |
|---|---|---|
| Composition | 6 | 0.6 |
| Example | 7 | 0.6 |
| | 8 | 0.8 |
| | 9 | 0.9 |
| | 10 | 0.6 |
| Comparative | 4 | 2.0 |
| Composition | 5 | 1.7 |
| Example | 6 | 2.3 |

(16) PCT Resistance:

The PCT resistance of the cured film was measured under the conditions of 121° C., saturation, and 50 hours and evaluated on the following criterion. The results are shown in Table 8. Incidentally, the test piece which could not be developed was not evaluated.

○: No discernible blister, separation, or discoloration of the cured film observed
Δ: Slight blister, separation, or discoloration of the cured film observed
X: Blister, separation, or discoloration of the cured film observed

TABLE 8

| | | PCT Resistance | | | | | | |
|---|---|---|---|---|---|---|---|---|
| Drying time at 80° C. (min.) | | 30 | 40 | 50 | 60 | 70 | 80 | 90 |
| Compositon | 6 | ○ | ○ | ○ | — | — | — | — |
| Example | 7 | ○ | ○ | ○ | ○ | ○ | — | — |
| | 8 | ○ | ○ | ○ | ○ | ○ | — | — |
| | 9 | ○ | ○ | ○ | ○ | ○ | ○ | ○ |
| | 10 | ○ | ○ | ○ | ○ | ○ | — | — |
| Comparative | 4 | X | X | X | — | — | — | — |
| Composition | 5 | Δ | Δ | — | — | — | — | — |
| Example | 6 | Δ | — | — | — | — | — | — |

(17) Resistance to Electroless Gold Plating:

Preparation of Test Piece:

The copper plane of a copper plated-throughhole printed circuit board having a prescribed pattern formed in advance thereon was surface-treated (surface polishing with the use of a roll buff No. 1200 (manufactured by Ishii Hyoki K.K.), subsequent jet-scrub polishing with the use of an abrasive No. 270 (manufactured by Ishii Hyoki K.K.), washing with water, and drying). The reslatant board was subjected to coating, drying, exposure, development and heating in the same manner as described above to thereby give a test piece. By using this test piece, electroless gold plating was effected by the method as specified below. Then the test piece was examined as to the change in appearance and subjected to a peeling test with the use of an adhesive cellophane tape and the peeling conditions of the cured film were evaluated. The results are shown in Table 9. Incidentally, the test piece which could not be developed was not evaluated.

○: Neither any change in appearance nor peeling of the cured film was observed.
Δ: No change in appearance was observed, though slight peeling of the cured film was observed.
X: The cured film suffered from lifting and plating penetration, and significant peeling of the cured film was observed in the peeling test.

Electroless Gold Plating Process:

1. Degreasing: Immerse the test piece in an acidic degreasing solution (an aqueous 20 vol. % solution of Metex L-5B manufactured by Japan MacDermid Co., Ltd.) at 30° C. for 3 minutes.
2. Rinsing: Immerse the test piece in running water for 3 minutes.
3. Soft etching: Immerse the test piece in an aqueous 14.3 wt. % ammonium persulfate solution at room temperature for 3 minutes.
4. Rinsing: Immerse the test piece in running water for 3 minutes.
5. Immersion in acid: Immerse the test piece in an aqueous 10 vol. % sulfuric acid solution for one minute at room temperature.
6. Rinsing: Immerse the test piece in running water for 30 seconds to one minute.
7. Introduction of catalyst: Immerse the test piece in a catalyst solution (an aqueous 10 vol. % solution of Metal Plate Activator 350 manufactured by Meltex Inc.) at 30° C. for 7 minutes.

8. Rinsing: Immerse the test piece in running water for 3 minutes.
9. Electroless nickel plating: Immerse the test piece in a nickel plating solution (an aqueous 20 vol. % solution of Melplate Ni-865M manufactured by Meltex Inc.) of pH 4.6 at 85° C. for 20 minutes.
10. Immersion in acid: Immerse the test piece in an aqueous 10 vol. % sulfuric acid solution at room temperature for one minute.
11. Rinsing: Immerse the test piece in running water for 30 seconds to one minute.
12. Electroless gold plating: Immerse the test piece in a gold plating solution (an aqueous solution of 15 vol. % of Aurolectroless UP manufactured by Meltex Inc. and 3 vol. % of gold potassium cyanide) of pH 6 at 95° C. for 10 minutes.
13. Rinsing: Immerse the test piece in running water for 3 minutes.
14. Rinsing with hot water: Immerse the test piece in hot water at 60° C. for 3 minutes. After sufficient washing with water, thorough draining, and drying, an electroless gold plated test piece is obtained.

TABLE 9

| | | Resistance to electroless gold plating | | | | | | |
|---|---|---|---|---|---|---|---|---|
| Drying time at 80° C. (min.) | | 30 | 40 | 50 | 60 | 70 | 80 | 90 |
| Composition Example | 6 | ○ | ○ | ○ | — | — | — | — |
| | 7 | ○ | ○ | ○ | ○ | ○ | — | — |
| | 8 | ○ | ○ | ○ | ○ | ○ | — | — |
| | 9 | ○ | ○ | ○ | ○ | ○ | ○ | ○ |
| | 10 | ○ | ○ | ○ | ○ | ○ | — | — |
| Comparative Composition Example | 4 | X | X | X | — | — | — | — |
| | 5 | Δ | Δ | — | — | — | — | — |
| | 6 | X | — | — | — | — | — | — |

By using a capton sheet (thickness: 25 μm) in place of the copper plated-throughhole printed circuit board having a prescribed pattern formed in advance thereon, the photocurable and thermosetting composition was applied thereto and cured in the same manner as described above and tested for flexing resistance, folding endurance, flexibility, and warpage.

(18) Flexing Resistance

This property was evaluated in accordance with the method specified in IPC-SM-840B TM2.4.29 under the conditions of ⅛ inch diameter and 10 cycles on the following criterion. The results are shown in Table 10. Incidentally, the test piece which could not be developed was not evaluated.

○: Absence of crack in the cured film
Δ: Presence of slight cracks in the cured film
X: Presence of cracks in the cured film

TABLE 10

| | | Flexing resistance | | | | | | |
|---|---|---|---|---|---|---|---|---|
| Drying time at 80° C. (min.) | | 30 | 40 | 50 | 60 | 70 | 80 | 90 |
| Composition Example | 6 | ○ | ○ | ○ | — | — | — | — |
| | 7 | ○ | ○ | ○ | ○ | ○ | — | — |
| | 8 | ○ | ○ | ○ | ○ | ○ | — | — |
| | 9 | ○ | ○ | ○ | ○ | ○ | ○ | ○ |
| | 10 | ○ | ○ | ○ | ○ | ○ | — | — |

TABLE 10-continued

| | | Flexing resistance | | | | | | |
|---|---|---|---|---|---|---|---|---|
| Drying time at 80° C. (min.) | | 30 | 40 | 50 | 60 | 70 | 80 | 90 |
| Comparative Composition Example | 4 | X | X | X | — | — | — | — |
| | 5 | X | X | — | — | — | — | — |
| | 6 | Δ | — | — | — | — | — | — |

(19) Folding Endurance:

The test piece was folded 180° over itself while positioning the cured film outside and evaluated on the following criterion. The results are shown in Table 11. Incidentally, the test piece which could not be developed was not evaluated.

○: Absence of crack in the cured film
Δ: Presence of slight cracks in the cured film
X: Presence of cracks in the cured film

TABLE 11

| | | Folding endurance | | | | | | |
|---|---|---|---|---|---|---|---|---|
| Drying time at 80° C. (min.) | | 30 | 40 | 50 | 60 | 70 | 80 | 90 |
| Composition Example | 6 | ○ | ○ | ○ | — | — | — | — |
| | 7 | ○ | ○ | ○ | ○ | ○ | — | — |
| | 8 | ○ | ○ | ○ | ○ | ○ | — | — |
| | 9 | ○ | ○ | ○ | ○ | ○ | ○ | ○ |
| | 10 | ○ | ○ | ○ | ○ | ○ | — | — |
| Comparative Composition Example | 4 | X | X | X | — | — | — | — |
| | 5 | X | X | — | — | — | — | — |
| | 6 | Δ | — | — | — | — | — | — |

(20) Flexibility:

This property was evaluated in the same testing method and criterion as those of (6) flexibility mentioned above. The results are shown in Table 12. Incidentally, the test piece which could not be developed was not evaluated.

TABLE 12

| | | Flexibility | | | | | | |
|---|---|---|---|---|---|---|---|---|
| Drying time at 80° C. (min.) | | 30 | 40 | 50 | 60 | 70 | 80 | 90 |
| Composition Example | 6 | ○ | ○ | ○ | — | — | — | — |
| | 7 | ○ | ○ | ○ | ○ | ○ | — | — |
| | 8 | ○ | ○ | ○ | ○ | ○ | — | — |
| | 9 | ○ | ○ | ○ | ○ | ○ | ○ | ○ |
| | 10 | ○ | ○ | ○ | ○ | ○ | — | — |
| Comparative Composition Example | 4 | X | X | X | — | — | — | — |
| | 5 | X | X | — | — | — | — | — |
| | 6 | Δ | — | — | — | — | — | — |

(21) Warpage

The cured film was cut into the size of 150×110 mm. The heights of the four corners from the bottom surface was measured and their average value (hereinafter referred to as "four corners average value") was calculated. The warpage was evaluated on the following criterion. The results are shown in Table 13. Incidentally, the test piece which could not be developed was not evaluated.

○: The four corners average value is less than 6 mm.
Δ: The four corners average value is not less than 6 mm and less than 12 mm.
X: The four corners average value is not less than 12 mm or impossible to measure because of curling.

TABLE 13

| | | Warpage | | | | | | |
|---|---|---|---|---|---|---|---|---|
| Drying time at 80° C. (min.) | | 30 | 40 | 50 | 60 | 70 | 80 | 90 |
| Composition Example | 6 | ○ | ○ | ○ | — | — | — | — |
| | 7 | ○ | ○ | ○ | ○ | ○ | — | — |
| | 8 | ○ | ○ | ○ | ○ | ○ | — | — |
| | 9 | ○ | ○ | ○ | ○ | ○ | ○ | ○ |
| | 10 | ○ | ○ | ○ | ○ | ○ | — | — |
| Comparative Composition Example | 4 | X | X | X | — | — | — | — |
| | 5 | X | X | — | — | — | — | — |
| | 6 | Δ | — | — | — | — | — | — |

(22) Electrical Insulating Properties:

By using a B pattern of a printed circuit board (thickness: 1.6 mm) specified by IPC in place of the copper plated-throughhole printed circuit board having a prescribed pattern formed in advance thereon, the photocurable and thermosetting composition was applied thereto and cured in the same manner as described above. The electrical insulating properties of the resultant cured film was evaluated on the following criterion.

Moistening condition: temperature 85° C., humidity 85% R.H., applied voltage 100V, 500 hours.

Measurement condition: measurement time 60 seconds, applied voltage 500V.

The results are shown in Table 14. Incidentally, the test piece which could not be developed was not evaluated.

○: Insulation resistance after moistening is not less than $10^9$ Ω and no migration of copper is found.

Δ: Insulation resistance after moistening is not less than $10^9$ Ω, but migration of copper is found.

X: Insulation resistance after moistening is not more than $10^8$ Ω and migration of copper is found.

TABLE 14

| | | Electrical insulating properties | | | | | | |
|---|---|---|---|---|---|---|---|---|
| Drying time at 80° C. (min.) | | 30 | 40 | 50 | 60 | 70 | 80 | 90 |
| Composition Example | 6 | ○ | ○ | ○ | — | — | — | — |
| | 7 | ○ | ○ | ○ | ○ | ○ | — | — |
| | 8 | ○ | ○ | ○ | ○ | ○ | — | — |
| | 9 | ○ | ○ | ○ | ○ | ○ | ○ | ○ |
| | 10 | ○ | ○ | ○ | ○ | ○ | — | — |
| Comparative Composition Example | 4 | ○ | ○ | ○ | — | — | — | — |
| | 5 | ○ | ○ | — | — | — | — | — |
| | 6 | ○ | — | — | — | — | — | — |

While certain specific working examples have been disclosed herein, the invention may be embodied in other specific forms without departing from the spirit or essential characteristics thereof. The described examples are therefore to be considered in all respects as illustrative and not restrictive.

As described above, since the carboxyl group-containing photosensitive resin of the present invention exhibits the flexibility and elongation improved by the chain extension of a phenolic novolak resin caused by an addition reaction of an alkylene oxide thereto and contains unsaturated groups and carboxylic groups introduced to the terminals of the respective side chains by the addition of an unsaturated group-containing monocarbxylic acid and the addition of a polybasic acid anhydride to the end hydroxyl groups caused by the addition reaction of the alkylene oxide, the resin exhibits improved reactivity and allows the production of a cured product having well-balanced heat resistance and toughness at a high level, excelling in hardness and flexibility, and exhibiting outstanding water resistance and resistance to chemicals, in cooperation with the chain extension. Furthermore, since the resin has end carboxylic groups, it allows the development with an aqueous alkali solution. Accordingly, by the use of a photocurable and thermosetting composition containing the carboxyl group-containing photosensitive resin of the present invention, it is possible to form a cured film excelling in various properties such as adhesiveness, resistance to soldering heat, resistance to moisture absorption, PCT resistance, resistance to electroless gold plating, flexing resistance, folding endurance, flexibility, warpage, and electrical insulating properties at a low cost with high productivity.

Accordingly, the composition is not only usable as an ultraviolet-curable type printing ink which is cured by the use of the active energy rays or other usage but also useful as a solder resist, an etching resist, a plating resist and an interlaminar insulating material to be used for the manufacture of a printed circuit board, a permanent mask to be used for the manufacture of a tape carrier package, a resist for a flexible circuit board, a resist for a color filter and the like. Further, since the photocurable and thermosetting composition of the present invention exhibit little warpage after curing, it allows easy mounting of parts or chips on the flexible printed circuit board or tape carrier package. Moreover, it is possible to produce the composition at low cost in comparison with a liquid polyimide ink heretofore used.

What is claimed is:

1. A carboxyl group-containing photosensitive resin obtained by reacting an unsaturated group-containing mono carboxylic acid (d) selected from the group consisting of acrylic acid, methacrylic acid, crotonic acid, cinnamic acid, α-cyanocinnamic acid, β-styrylacrylic acid, and β-furfuryl acrylic acid, with a reaction product (c) of a phenolic novolak resin (a) and an alkylene oxide (b) to give rise to a reaction product (e) and further reacting a polybasic acid anhydride (f) with the resultant reaction product (e), said photosensitive resin having an acid value in the range of 30 to 150 mg KOH/g.

2. The carboxyl group-containing photosensitive resin according to claim 1, wherein said unsaturated group-containing monocarboxylic acid (d) is acrylic acid and/or methacrylic acid.

3. The carboxyl group-containing photosensitive resin according to claim 1, wherein the polybasic acid anhydride (f) is an alicyclic dibasic acid anhydride.

4. The carboxyl group-containing photosensitive resin according to claim 1, wherein the ratio of addition of the alkylene oxide (b) to the phenolic novolak resin (a) is in the range of 0.3 to 10.0 mols per one equivalent of a phenolic hydroxyl group of the phenolic novolak resin (a).

5. An alkali-developapble, photocurable and thermosetting composition, comprising (A) a carboxyl group-containing photosensitive resin obtained by reacting an unsaturated group-containing monocarboxylic acid (d) with a reaction product (c) of a phenolic novolak resin (a) and an alkylene oxide (b) to give rise to a reaction product (e) and further reacting a polybasic acid anhydride (f) with the resultant reaction product (e), (C) a photopolymerization initiator, and (D) an epoxy resin.

6. The photocurable and thermosetting composition according to claim 5, further comprising (E) an organic solvent.

7. The photocurable and thermosetting composition according to claim 5, further comprising (F) a curing catalyst.

8. The photocurable and thermosetting composition according to claim 7, which contains the curing catalyst (F) in an amount of 0.1 to 20 parts by weight, based on 100 parts by weight (as solids) of said carboxyl group-containing photosensitive resin (A).

9. The photocurable and thermosetting composition according to claim 5, which contains the photopolymerization initiator (C) in an amount of 0.5 to 25 parts by weight and the epoxy resin (D) in an amount of 10 to 70 parts by weight, based on 100 parts by weight (as solids) of said carboxyl group-containing photosensitive resin (A).

10. The photocurable and thermosetting composition according to claim 5, further comprising an inorganic filler in an amount of 10 to 300 parts by weight, based on 100 parts by weight (as solids) of said carboxyl group-containing photosensitive resin (A).

11. The photocurable and thermosetting composition according to claim 5, further comprising at least one compound selected from the group consisting of a coloring agent, a thermal polymerization inhibitor, a thickening agent, an anti-foaming agent, a leveling agent, and a silane coupling agent.

12. A cured product obtained by curing the photocurable and thermosetting composition according to claim 5 by means of irradiation of active energy rays and heating.

13. An alkali-developable, photocurable and thermosetting composition, comprising (A) a carboxyl group-containing photosensitive resin obtained by reacting an unsaturated group-containing monocarboxylic acid (d) with a reaction product (c) of a phenolic novolak resin (a) and an alkylene oxide (b) to give rise to a reaction product (e) and further reacting a polybasic acid anhydride (f) with the resultant reaction product (e), (B) a photosensitive (meth) acrylate compound, (C) a photopolymerization initiator, and (D) an epoxy resin.

14. The photocurable and thermosetting composition according to claim 13, further comprising (E) an organic solvent.

15. The photocurable and thermosetting composition according to claim 13, further comprising (F) a curing catalyst.

16. The photocurable and thermosetting composition according to claim 15, which contains the curing catalyst (F) in an amount of 0.1 to 20 parts by weight, based on 100 parts by weight (as solids) of said carboxyl group-containing photosensitive resin (A).

17. The photocurable and thermosetting composition according to claim 13, which contains the photosensitive (meth)acrylate compound (B) in an amount of not more than 50 parts by weight, the photopolymerization initiator (C) in an amount of 0.5 to 25 parts by weight and the epoxy resin (D) in an amount of 10 to 70 parts by weight, based on 100 parts by weight (as solids) of said carboxyl group-containing photosensitive resin (A).

18. The photocurable and thermosetting composition according to claim 13, further comprising an inorganic filler in an amount of 10 to 300 parts by weight, based on 100 parts by weight (as solids) of said carboxyl group-containing photosensitive resin (A).

19. The photocurable and thermosetting composition according to claim 13, further comprising at least one compound selected from the group consisting of a coloring agent, a thermal polymerization inhibitor, a thickening agent, an anti-foaming agent, a leveling agent, and a silane coupling agent.

20. A cured product obtained by curing the photocurable and thermosetting composition according to claim 13 by means of irradiation of active energy rays and heating.

* * * * *